United States Patent
Kumamoto et al.

(10) Patent No.: US 10,497,535 B2
(45) Date of Patent: Dec. 3, 2019

(54) CHARGED PARTICLE BEAM DEVICE AND SCANNING ELECTRON MICROSCOPE

(71) Applicant: Matsusada Precision, Inc., Kusatsu-shi, Shiga (JP)

(72) Inventors: Kazuya Kumamoto, Kusatsu (JP); Sadayoshi Matsuda, Kusatsu (JP)

(73) Assignee: Matsusada Precision, Inc., Kusatsu-shi, Shiga (JP)

( * ) Notice: Subject to any disclaimer, the term of this patent is extended or adjusted under 35 U.S.C. 154(b) by 0 days.

(21) Appl. No.: 15/780,064

(22) PCT Filed: Nov. 29, 2016

(86) PCT No.: PCT/JP2016/085406
§ 371 (c)(1),
(2) Date: May 30, 2018

(87) PCT Pub. No.: WO2017/094721
PCT Pub. Date: Jun. 8, 2017

(65) Prior Publication Data
US 2018/0358199 A1    Dec. 13, 2018

(30) Foreign Application Priority Data
Dec. 3, 2015    (JP) .................................. 2015-237010

(51) Int. Cl.
*H01J 37/10* (2006.01)
*H01J 37/244* (2006.01)
(Continued)

(52) U.S. Cl.
CPC ............ *H01J 37/10* (2013.01); *H01J 37/141* (2013.01); *H01J 37/22* (2013.01); *H01J 37/244* (2013.01);
(Continued)

(58) Field of Classification Search
CPC .......... H01J 37/10; H01J 37/141; H01J 37/22; H01J 37/244; H01J 37/28; H01J 37/228;
(Continued)

(56) References Cited

U.S. PATENT DOCUMENTS 3,870,891 A    3/1975 Mulvey
4,540,885 A    9/1985 Plies et al.
(Continued)

FOREIGN PATENT DOCUMENTS

DE    3921179 A1    1/1991
EP    2521157 A1    11/2012
(Continued)

OTHER PUBLICATIONS

Supplementary Partial European Search Report issued in European Patent Application No. 16870658.8, dated Nov. 30, 2018.
(Continued)

*Primary Examiner* — Nicole M Ippolito
*Assistant Examiner* — Sean M Luck
(74) *Attorney, Agent, or Firm* — Mintz Levin Cohn Ferris Glovsky and Popeo, P.C.; David G. Conlin; Steven M. Jensen

(57) ABSTRACT

A charged particle beam device includes: a charged particle source configured to emit a charged particle beam; an acceleration electric power source connected to the charged particle source and configured to accelerate the charged particle beam; a second objective lens configured to focus the charged particle beam onto a sample; and a second detector. The second objective lens is positioned on the opposite side of the sample from where the charged particle beam is incident on the sample. The second detector is configured to receive at least one of: an electromagnetic wave that the sample emits upon receiving the charged particle beam, and an electromagnetic wave that the sample
(Continued)

reflects upon receiving the charged particle beam. The second detector carries out a detection of the received electromagnetic wave(s).

25 Claims, 18 Drawing Sheets

(51) Int. Cl.
  *H01J 37/28* (2006.01)
  *H01J 37/141* (2006.01)
  *H01J 37/22* (2006.01)

(52) U.S. Cl.
  CPC .............. *H01J 37/28* (2013.01); *H01J 37/228* (2013.01); *H01J 2237/2445* (2013.01); *H01J 2237/2448* (2013.01); *H01J 2237/24475* (2013.01)

(58) Field of Classification Search
  CPC ..... H01J 2237/2445; H01J 2237/24475; H01J 2237/2448
  See application file for complete search history.

(56) References Cited

U.S. PATENT DOCUMENTS

| | | | |
|---|---|---|---|
| 4,551,625 A | 11/1985 | Lischke et al. | |
| 5,578,821 A | 11/1996 | Meisberger et al. | |
| 5,872,358 A | 2/1999 | Todokoro et al. | |
| 5,981,947 A | 11/1999 | Nakasuji et al. | |
| 6,051,839 A | 4/2000 | Crewe | |
| 6,452,175 B1 | 9/2002 | Adamec | |
| 6,531,697 B1* | 3/2003 | Nakamura | H01J 37/1471 250/302 |
| 6,538,249 B1 | 3/2003 | Takane et al. | |
| 7,105,816 B2* | 9/2006 | Kamiya | H01J 37/244 250/307 |
| 7,619,219 B2 | 11/2009 | Suzuki et al. | |
| 7,947,951 B2* | 5/2011 | Khursheed | H01J 37/05 250/305 |
| 8,299,432 B2* | 10/2012 | Toth | H01J 37/244 250/306 |
| 2003/0136907 A1 | 7/2003 | Takane et al. | |
| 2004/0069956 A1 | 4/2004 | Takane et al. | |
| 2004/0084629 A1 | 5/2004 | Preikszas et al. | |
| 2004/0188611 A1 | 9/2004 | Takeuchi et al. | |
| 2005/0184237 A1 | 8/2005 | Takane et al. | |
| 2006/0060782 A1 | 3/2006 | Khursheed | |
| 2007/0023657 A1 | 2/2007 | Takane et al. | |
| 2008/0116376 A1 | 5/2008 | Takane et al. | |
| 2008/0128617 A1 | 6/2008 | Yamaguchi et al. | |
| 2010/0091362 A1 | 4/2010 | Isozaki et al. | |
| 2010/0213371 A1 | 8/2010 | Yamaguchi et al. | |
| 2013/0088775 A1* | 4/2013 | Nagayama | H01J 37/228 359/368 |
| 2014/0166893 A1 | 6/2014 | Yamada | |

FOREIGN PATENT DOCUMENTS

| | | |
|---|---|---|
| GB | 2183898 A | 6/1987 |
| JP | 58-119145 A | 7/1983 |
| JP | 58-173161 U1 | 11/1983 |
| JP | 03-295141 A | 12/1991 |
| JP | 05-299048 | 11/1993 |
| JP | 06-181041 A | 6/1994 |
| JP | 08-068772 A | 3/1996 |
| JP | 09-035679 A | 2/1997 |
| JP | 10-223169 A | 8/1998 |
| JP | 10-289681 A | 10/1998 |
| JP | 2000-348658 A | 12/2000 |
| JP | 2001-083087 A | 3/2001 |
| JP | 2001-084944 A | 3/2001 |
| JP | 2002-075263 A | 3/2002 |
| JP | 2004-134379 A | 4/2004 |
| JP | 2004-214060 A | 7/2004 |
| JP | 2005-005056 A | 1/2005 |
| JP | 2006-093161 A | 4/2006 |
| JP | 2007-250223 A | 9/2007 |
| JP | 2008-159574 A | 7/2008 |
| JP | 2014-120545 A | 6/2014 |

OTHER PUBLICATIONS

International Search Report for International Application No. PCT/JP2016/085406, dated Feb. 21, 2017.
International Preliminary Report on Patentability for International Application No. PCT/JP20161085406, dated Jun. 7, 2018.

* cited by examiner

CHARGED PARTICLE BEAM DEVICE AND SCANNING ELECTRON MICROSCOPE

TECHNICAL FIELD

The present invention relates to a charged particle beam device and a scanning electron microscope. More specifically, the present invention relates to a charged particle beam device and a scanning electron microscope each of which can achieve an improved performance.

BACKGROUND ART

Examples of a charged particle beam device include a scanning electron microscope (hereinafter referred to as SEM), an electron probe micro analyzer (EPMA), an electron beam welder, an electron beam writing device, and an ion beam microscope.

Conventional SEMs include lenses that are each configured to have a short focus for a higher resolution. Increasing resolution requires increasing the magnetic flux density for the magnetic flux density distribution B(z) of the lens along the optical axis, and also requires decreasing the thickness of the lens, that is, the z width for the magnetic flux density distribution.

Patent Literature 1 below discloses an SEM including two objective lenses (namely, a first objective lens and a second objective lens). Hereinafter, a lens on the electron gun side of a sample is referred to as first objective lens, whereas a lens on the side opposite to the electron gun side of a sample is referred to as second objective lens. The second objective lens is used particularly in a high-resolution observation mode in which the accelerating voltage Vacc is low, specifically, within a range of 0.5 kV to 5 kV. The first objective lens is used in a normal observation mode in which the accelerating voltage Vacc is within a range of 0.5 kV to 30 kV.

The technique disclosed in Patent Literature 1 below does not allow the first objective lens and the second objective lens to operate simultaneously. The first objective lens and the second objective lens are switched by a mode switching means in accordance with the mode. Patent Literature 1 below also discloses in the second embodiment (see paragraph [0017]) separating part of the magnetic poles of the second objective lens from the rest with use of an electric insulator in terms of electric current and electric potential. A voltage Vdecel is applied between the part of the magnetic poles and the sample.

Patent Literature 1 below discloses in the first embodiment (paragraphs [0010] to [0016]) disposing a secondary electron (or backscattered electron) detector at a position closer to the electron gun than the first objective lens is. Secondary electrons (or backscattered electrons) generated by the sample pass through the first objective lens and enter the detector.

Patent Literature 2 below also discloses an SEM configuration. The SEM of Patent Literature 2 is configured to include an objective lens disposed on the side of a sample which side is opposite to the electron gun side. Secondary electrons are deflected by an attracting electric field of a secondary electron detector and captured by the secondary electron detector.

CITATION LIST

Patent Literature

[Patent Literature 1] Japanese Patent Application Publication, Tokukai, No. 2007-250223

[Patent Literature 2] Japanese Patent Application Publication, Tokukaihei, No. 6-181041

SUMMARY OF INVENTION

Technical Problem

It is an object of the present invention to allow a charged particle beam device or a scanning electron microscope to achieve an improved performance.

Solution to Problem

In order to attain the above object, according to an aspect of the present invention, a charged particle beam device includes: a charged particle source configured to emit a charged particle beam; an acceleration electric power source connected to the charged particle source and configured to accelerate the charged particle beam emitted by the charged particle source; a second objective lens configured to focus the charged particle beam onto a sample; and a second detector configured to receive at least one of (i) a first electromagnetic wave that the sample emits upon incidence of the charged particle beam thereon and (ii) a second electromagnetic wave that the sample reflects upon incidence of the charged particle beam thereon, and configured to carry out a detection of the first electromagnetic wave and/or the second electromagnetic wave thus received, the second objective lens being positioned on the opposite side of the sample from where the charged particle beam is incident on the sample.

Advantageous Effects of Invention

The present invention allows a charged particle beam device or a scanning electron microscope to achieve an improved performance.

Figure 7:
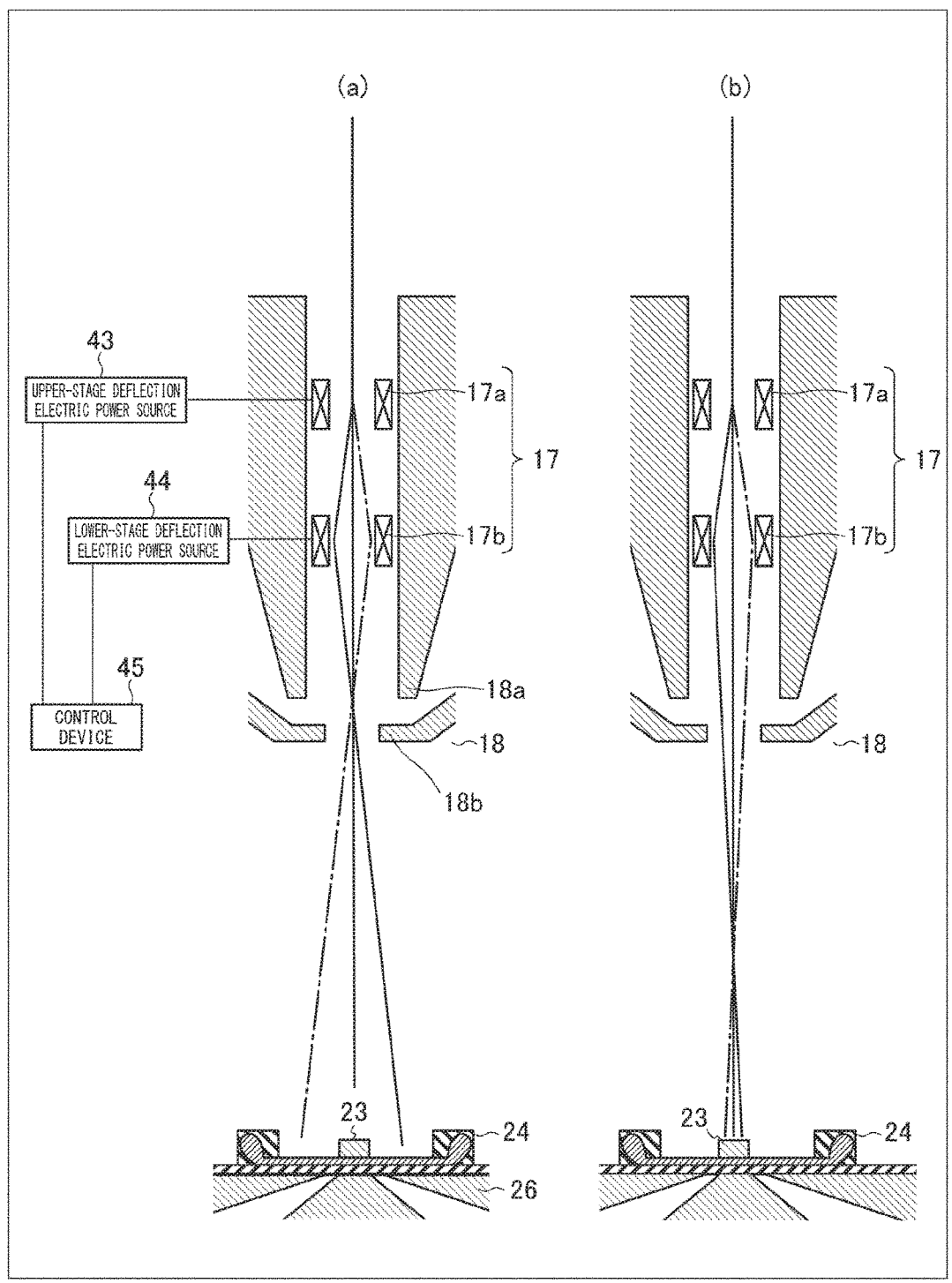

FIG. 7 is a diagram for description of how a point of intersection of deflection is adjusted through adjustment of the ratio of the respective intensities of upper and lower deflection coils of a deflection coil unit of Embodiment 1 of the present invention.

Figure 8:
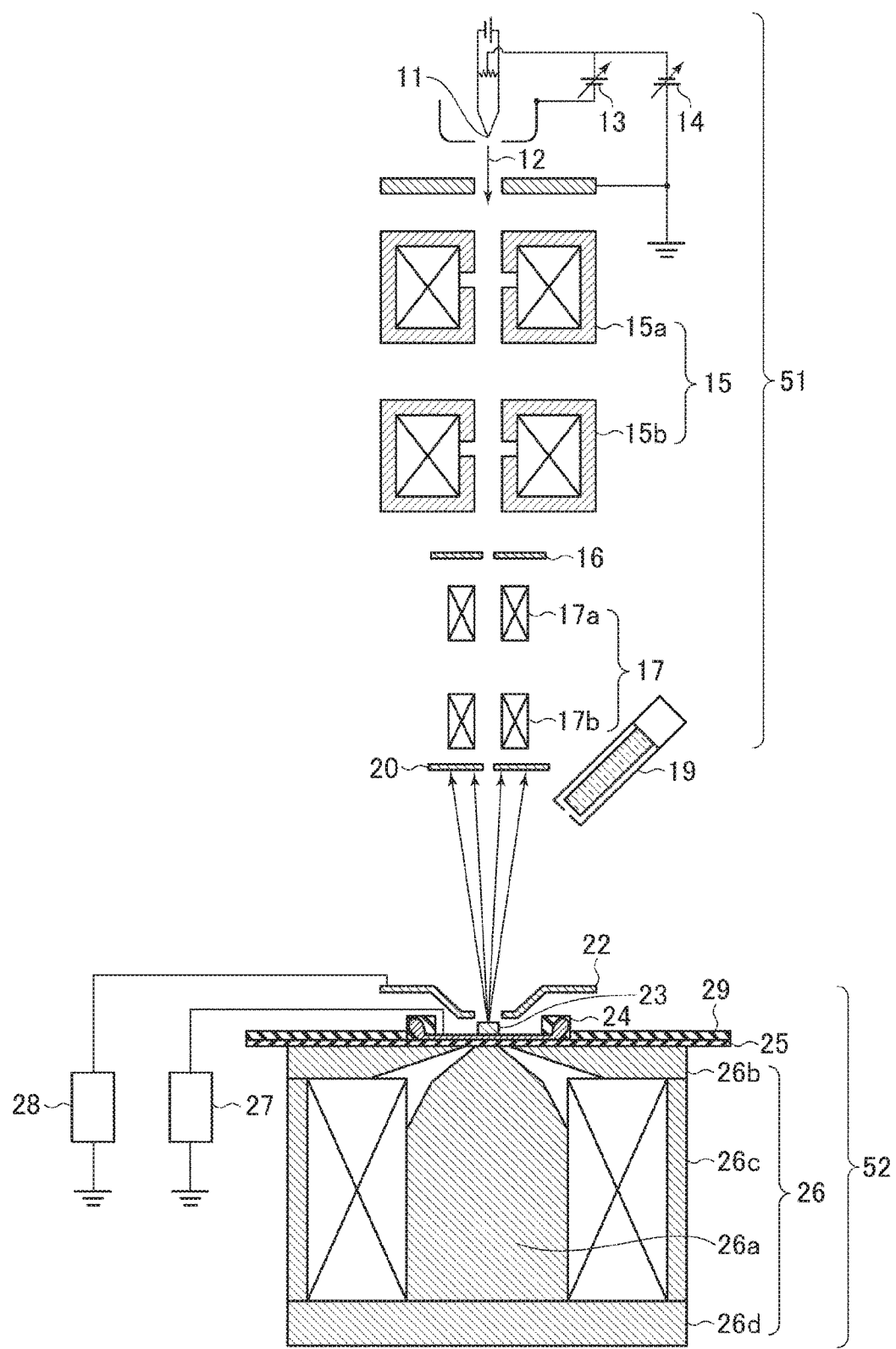

FIG. 8 is a cross-sectional view of an SEM of Embodiment 2 of the present invention, the view schematically illustrating a simple configuration not including a first objective lens.

Figure 9:
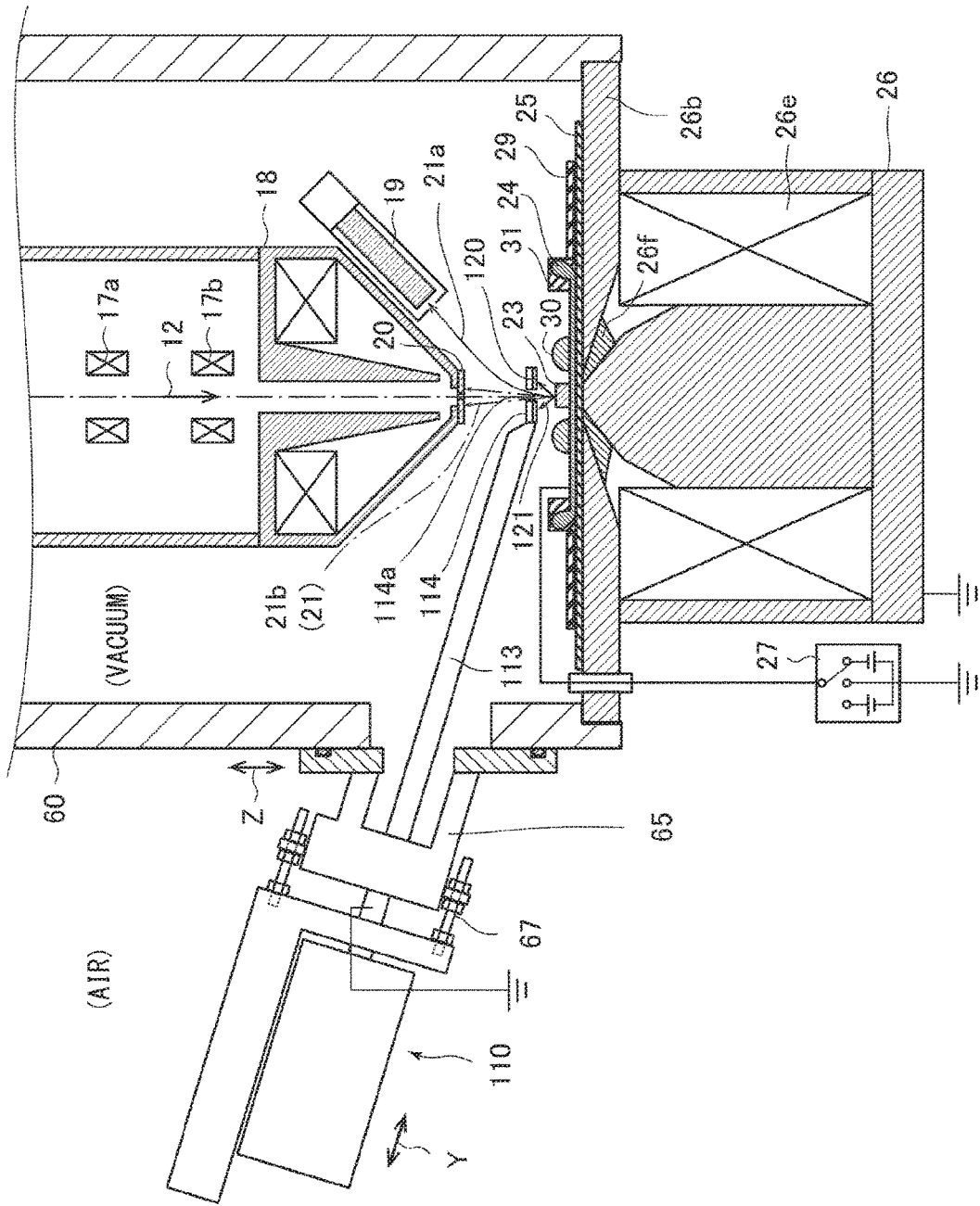

FIG. 9 is a cross-sectional view generally illustrating an example of a device configuration of an SEM in accordance with Embodiment 4 of the present invention.

Figure 10:
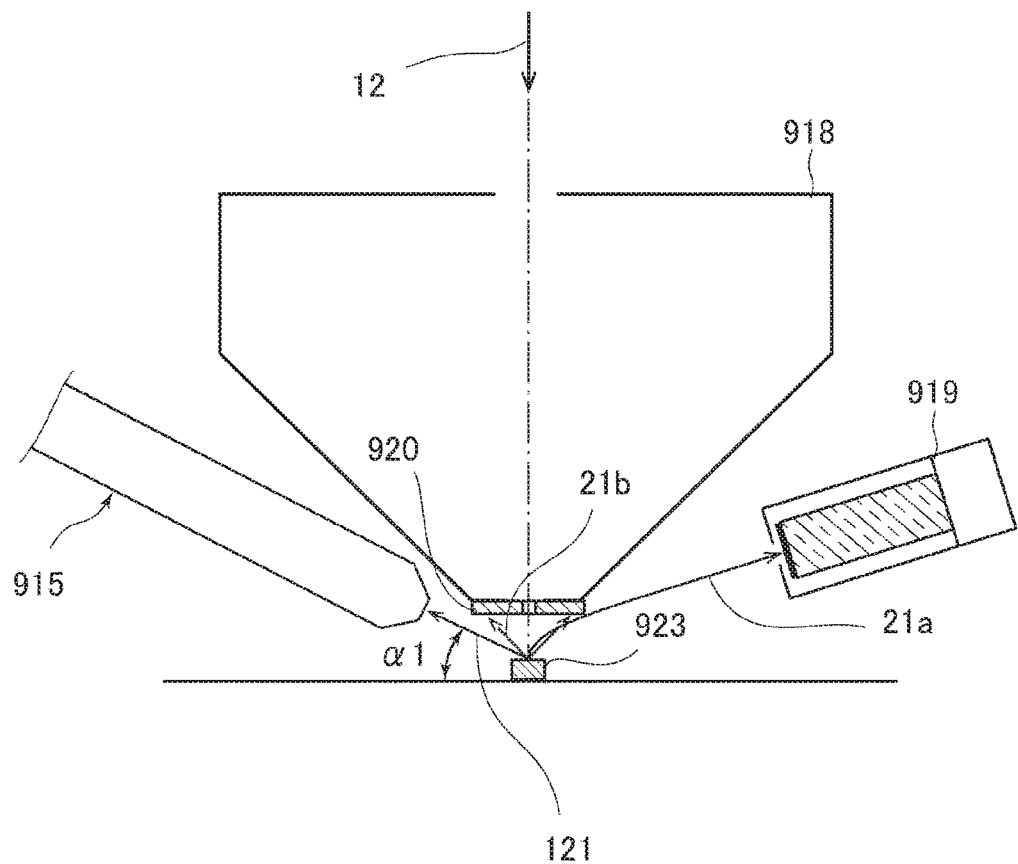

FIG. 10 is a cross-sectional view schematically illustrating a device configuration of an SEM having a conventional structure.

Figure 11:
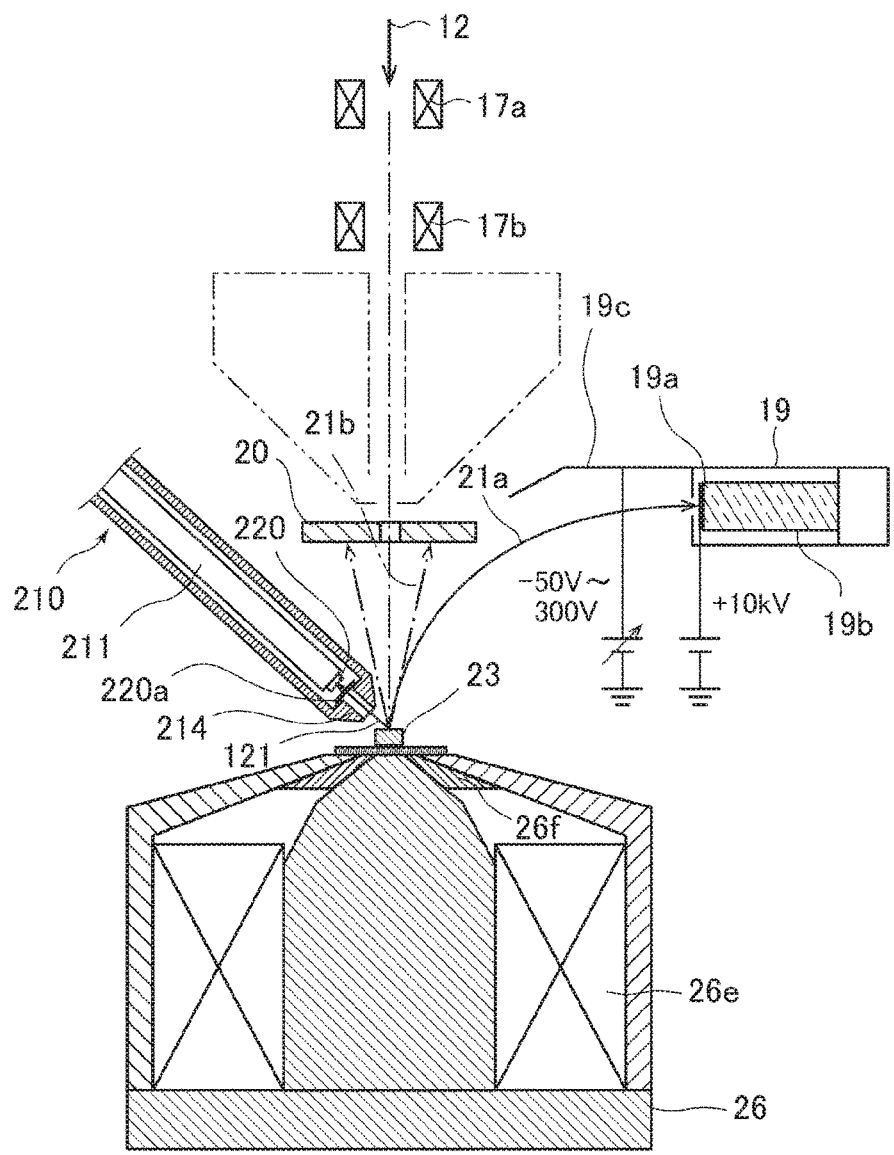

FIG. 11 is a cross-sectional view illustrating a variation of the device configuration of the SEM in accordance with Embodiment 4.

Figure 12:
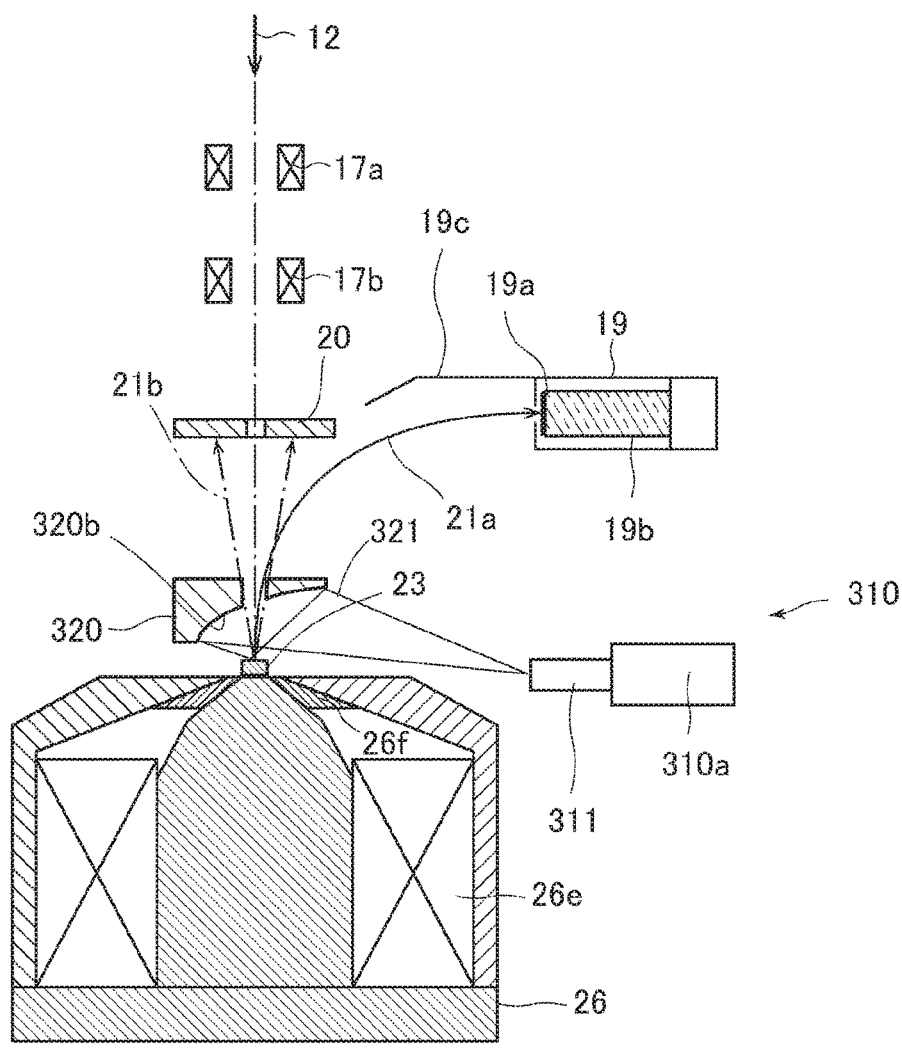

FIG. 12 is a cross-sectional view illustrating another variation of the device configuration of the SEM in accordance with Embodiment 4.

Figure 13:
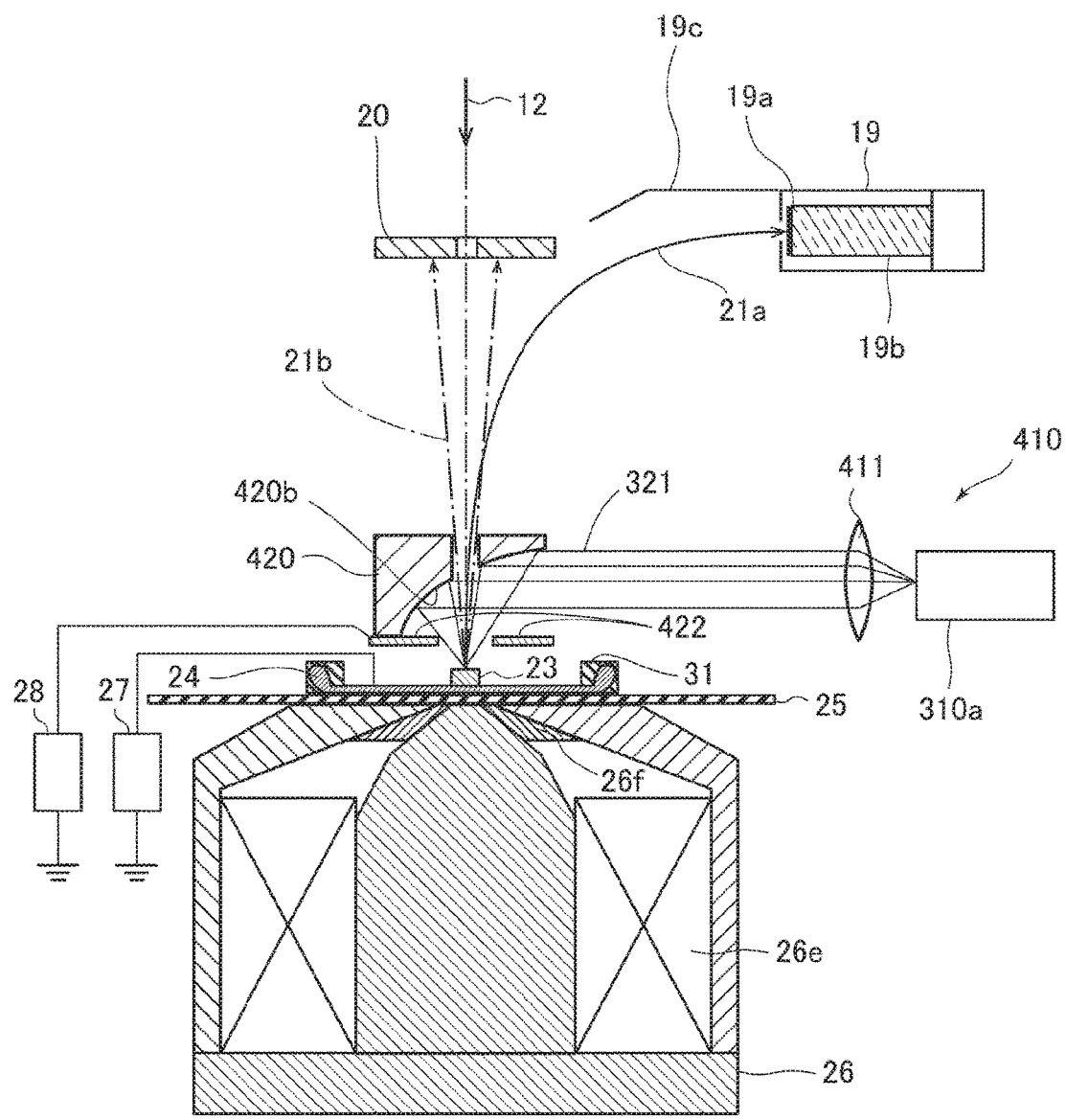

FIG. 13 is a cross-sectional view illustrating still another variation of the device configuration of the SEM in accordance with Embodiment 4.

Figure 14:
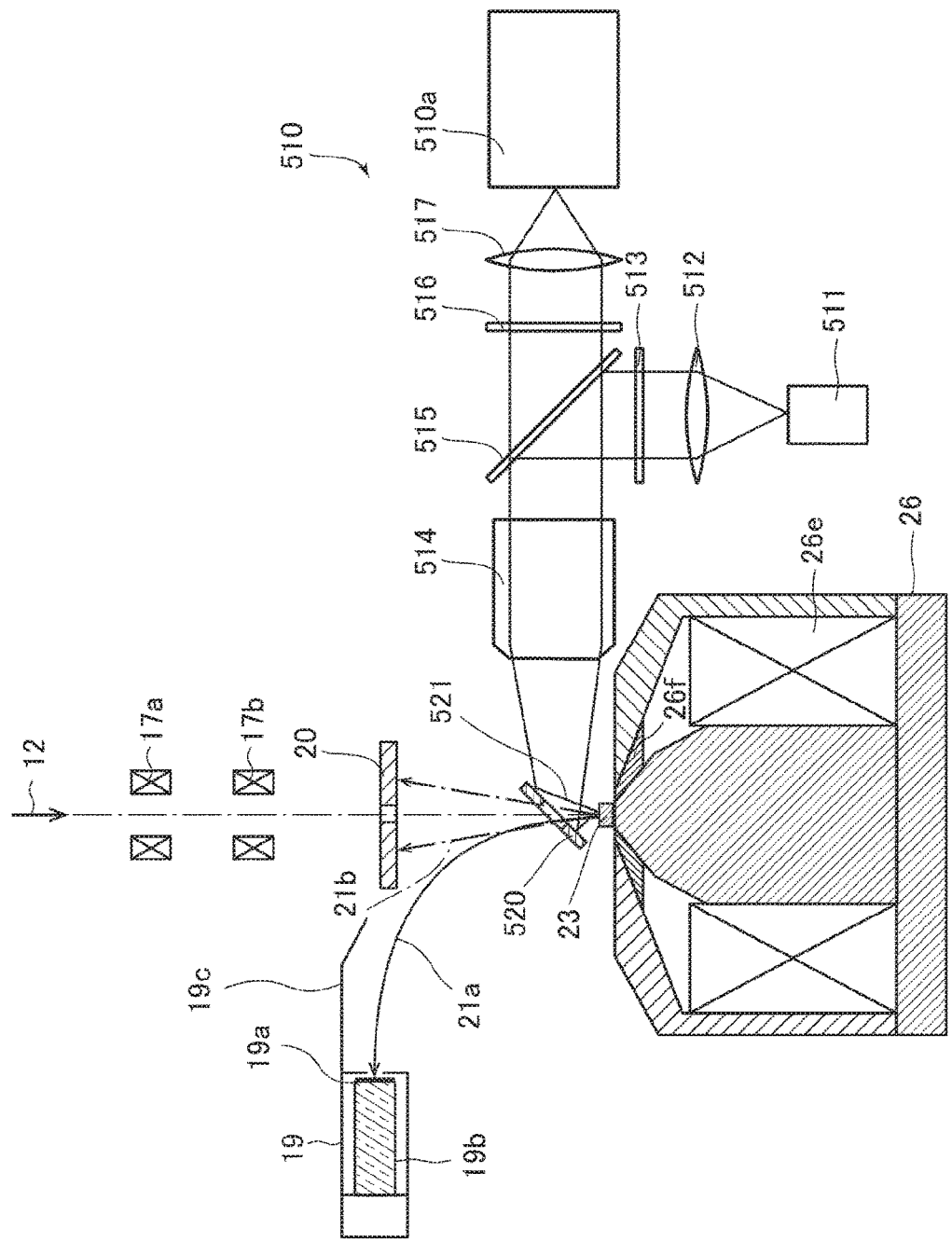

FIG. 14 is a cross-sectional view illustrating still another variation of the device configuration of the SEM in accordance with Embodiment 4.

Figure 15:
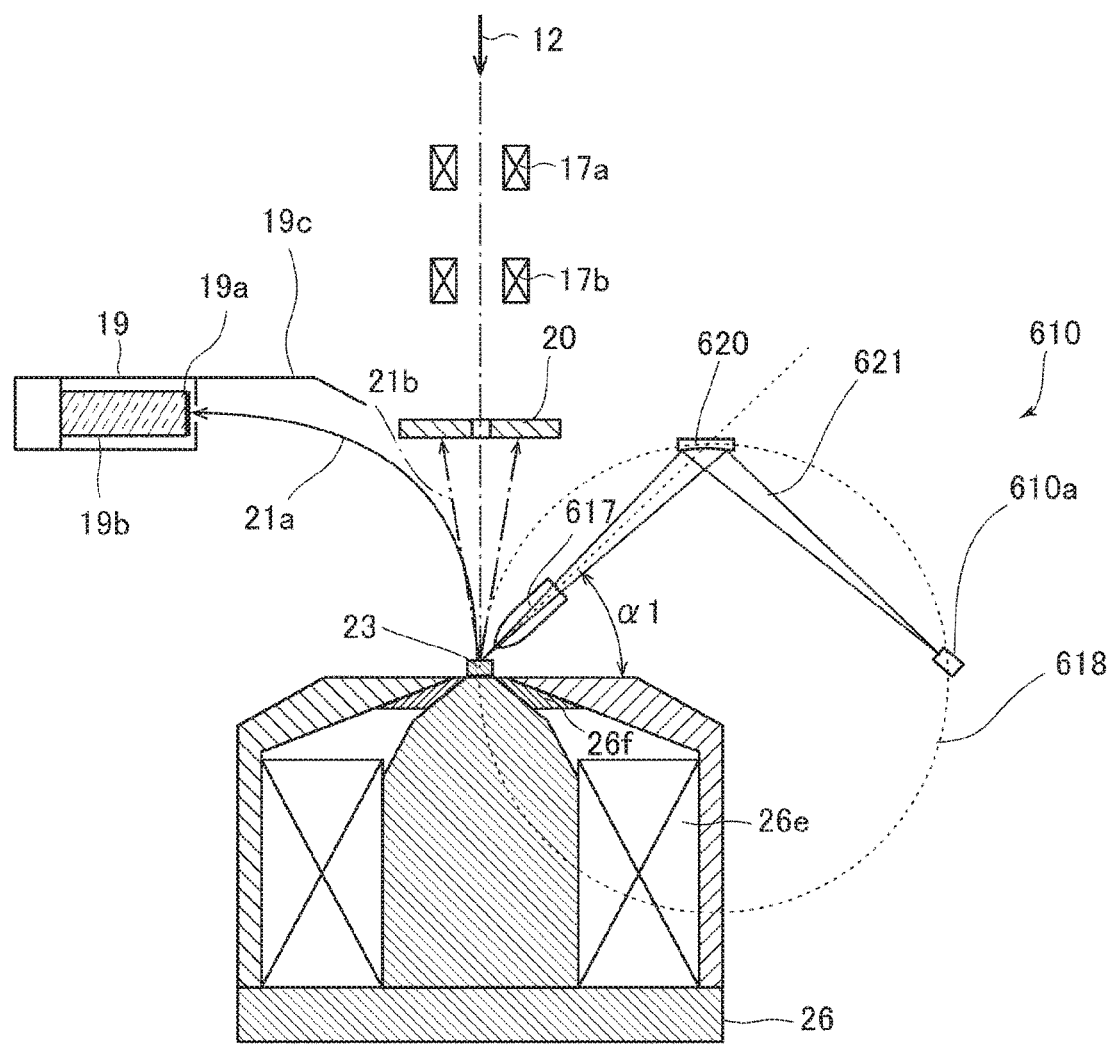

FIG. 15 is a cross-sectional view illustrating still another variation of the device configuration of the SEM in accordance with Embodiment 4.

Figure 16:
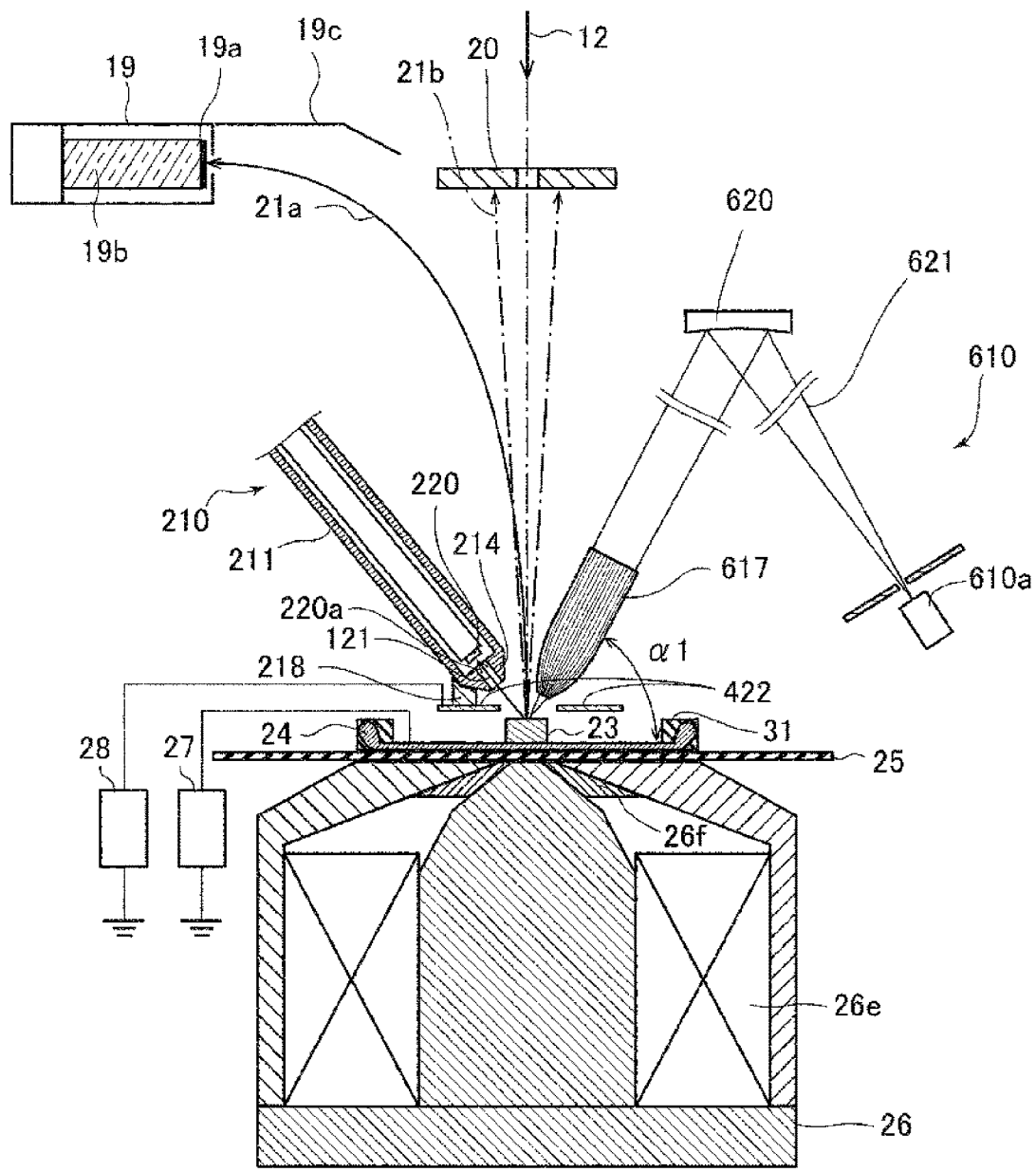

FIG. 16 is a cross-sectional view illustrating still another variation of the device configuration of the SEM in accordance with Embodiment 4.

Figure 17:
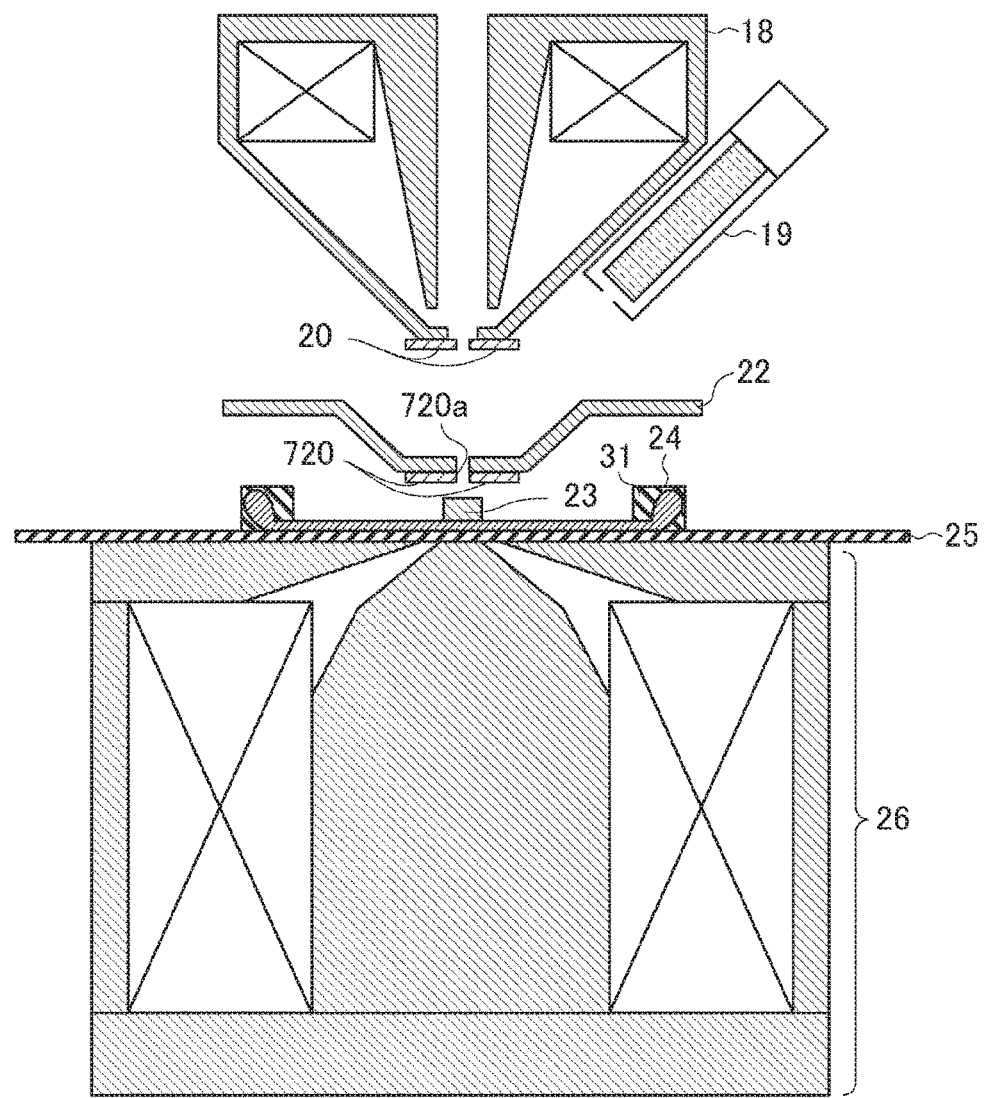

FIG. 17 is a cross-sectional view illustrating an example of a device configuration of an SEM in accordance with Embodiment 5 of the present invention.

Figure 18:
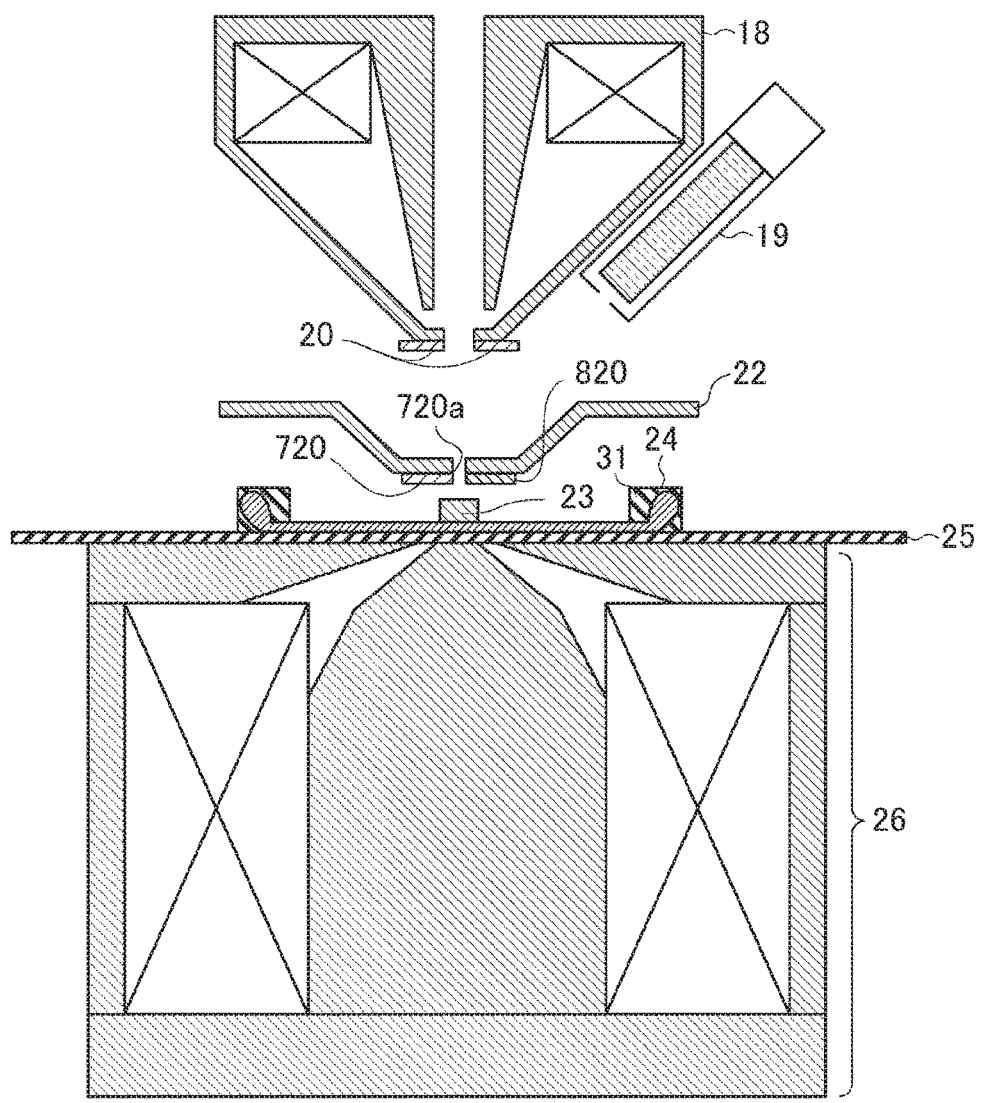

FIG. 18 is a cross-sectional view illustrating a variation of the device configuration of the SEM in accordance with Embodiment 5.

DESCRIPTION OF EMBODIMENTS

The following description will discuss embodiments of the present invention with reference to the drawings. It should be noted that the drawings referred to below are schematic and that the dimensions and length-to-width ratios of the drawings differ from the actual ones.

The embodiments below of the present invention are illustrative of devices, methods, and the like for realization of the technical idea of the present invention. The technical idea of the present invention is not particularly limited as described below in terms of the material, shape, structure, placement, and the like of each element. The technical idea of the present invention can be changed variously within the technical scope defined in the claims.

Embodiment 1

The description below deals with a schematic configuration of a SEM as Embodiment 1 of the present invention with reference to FIG. 1.

The SEM is an electron beam device including an electron source (charged particle source) 11, an acceleration electric power source 14, a condensing lens unit 15, an objective-lens aperture 16, a two-stage deflection coil unit 17, objective lenses 18 and 26, and a detector 20. The acceleration electric power source 14 accelerates a primary electron beam (charged particle beam) 12 emitted by the electron source 11. The condensing lens unit 15 focuses the accelerated primary electron beam 12. The objective-lens aperture 16 removes an unnecessary portion of the primary electron beam 12. The two-stage deflection coil unit 17 scans a sample 23 two-dimensionally with the primary electron beam 12. The objective lenses 18 and 26 focus the primary electron beam 12 onto the sample 23. The detector 20 detects signal electrons 21 (secondary electrons 21a, backscattered electrons 21b) emitted by the sample 23.

The SEM includes a first objective lens electric power source 41, a second objective lens electric power source 42, and a control device 45 collectively as a control section for electromagnetic lenses. The first objective lens electric power source 41 can change the intensity of the first objective lens 18. The second objective lens electric power source 42 can change the intensity of the second objective lens 26. The control device 45 controls the first objective lens electric power source 41 and the second objective lens electric power source 42.

The control device 45 is capable of controlling the respective intensities of the first objective lens 18 and the second objective lens 26 independently of each other. The control device 45 is capable of controlling the two lenses simultaneously. Further, the two electric power sources are connected to the control device 45 so as to be adjustable (not shown in FIG. 1).

The electron source 11 can be of a thermoelectronic emission type (thermoelectron source) or of a field emission type (Schottky type or cold cathode type). The electron source 11 of Embodiment 1 is (i) a crystalline electron source of the thermoelectronic emission type such as LaB6 or (ii) a tungsten filament. An accelerating voltage of, for example, −0.5 kV to −30 kV is applied between the electron source 11 and an anode plate (ground potential). The Wehnelt electrode 13 is supplied with an electrical potential more negative than the electrical potential of the electron source 11. This controls the amount of the primary electron beam 12 emitted by the electron source 11. The primary electron beam 12 has a crossover diameter (that is, the minimum diameter) immediately in front of the electron source 11. This minimum diameter is referred to as the size So of the electron source.

The accelerated primary electron beam 12 is focused through the condensing lens unit 15. This allows the size So of the electron source to be reduced. The condensing lens unit 15 adjusts the reduction ratio and the current for illumination of the sample 23 (hereinafter referred to as "probe current"). The objective-lens aperture 16 removes electrons in unnecessary trajectories. The objective-lens aperture 16 has a bore diameter that defines how to adjust the aperture angle α and probe current of a beam incident on the sample 23.

The primary electron beam 12 having passed through the objective-lens aperture 16 passes through the two-stage deflection coil unit 17 for scanning and then passes through the first objective lens 18. A general-purpose SEM uses a first objective lens 18 to focus a primary electron beam 12 onto a sample 23. The SEM illustrated in FIG. 1 may be used as described above.

Figure 1:
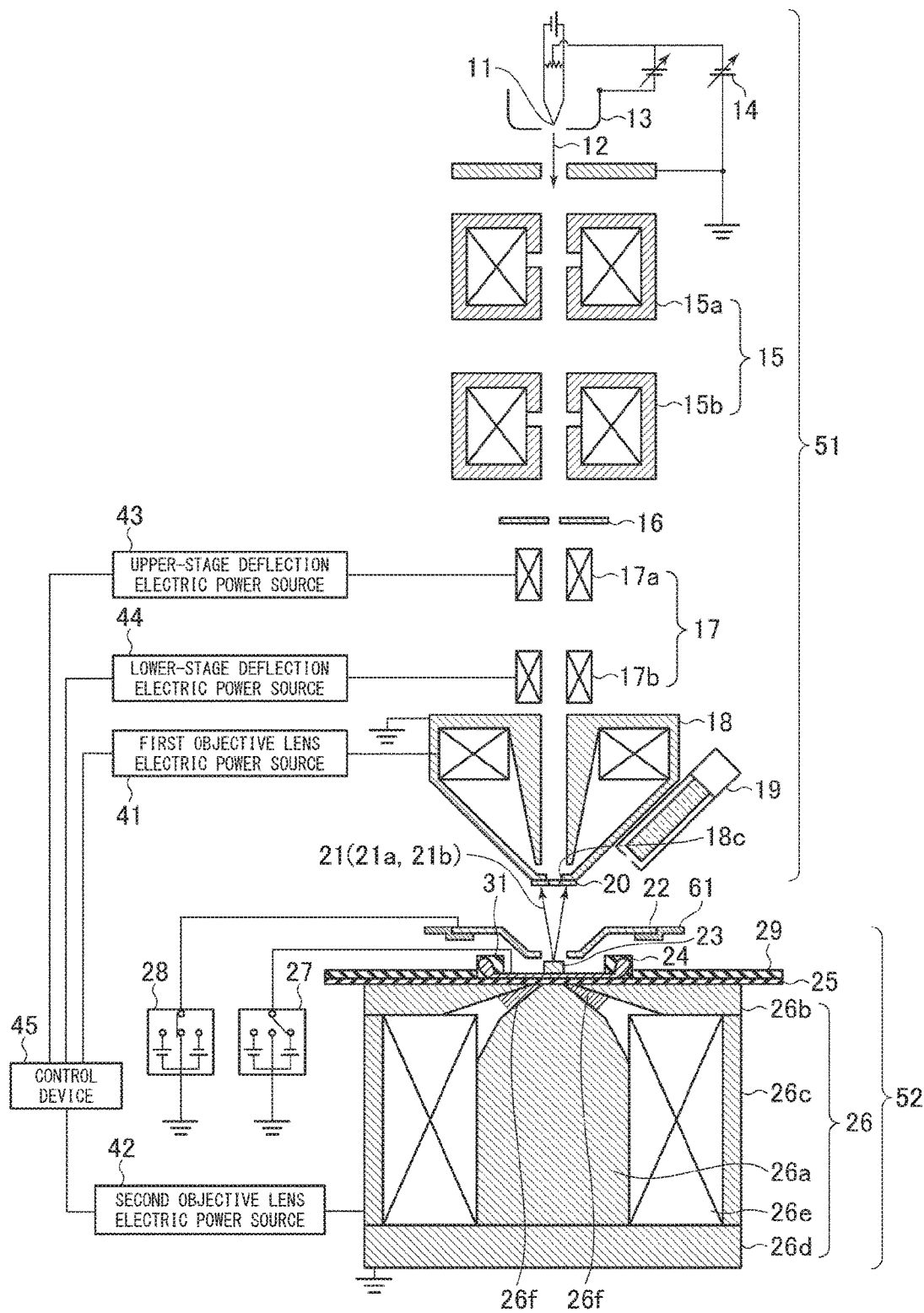
FIG. 1 is a cross-sectional view of an SEM of Embodiment 1 of the present invention, the view schematically illustrating a configuration of the SEM.

The members ranging from the electron source 11 to the first objective lens 18 in FIG. 1 constitute an upper unit 51 for causing a primary electron beam 12 to be emitted toward a sample 23. FIG. 1 also shows an electric potential plate 22 and other members disposed therebelow, which constitute a lower unit 52. The lower unit 52 holds the sample 23. The upper unit 51 has a hole section 18c, from which a charged particle beam having passed through the upper unit 51 is emitted from the upper unit 51. In Embodiment 1, the hole section 18c is present in the first objective lens 18. The detector 20 is disposed between the upper unit 51 and the lower unit 52. More specifically, the detector 20 is attached below the hole section 18c. The detector 20 also has an opening through which a primary electron beam 12 passes. The detector 20 is attached to a lower portion of the first objective lens 18 in such a manner that the hole section 18c and the opening coincide with each other. The upper unit 51 may include a plurality of detectors 20 attached to a lower portion of the first objective lens 18. Such a plurality of detectors 20 are attached in such a manner that the detectors 20 do not block the trajectory of the primary electron beam 12 and that the respective detecting sections of the detectors 20 are separated by as small a gap as possible from any portion of the upper unit 51 other than the hole section 18c.

Figure 2:
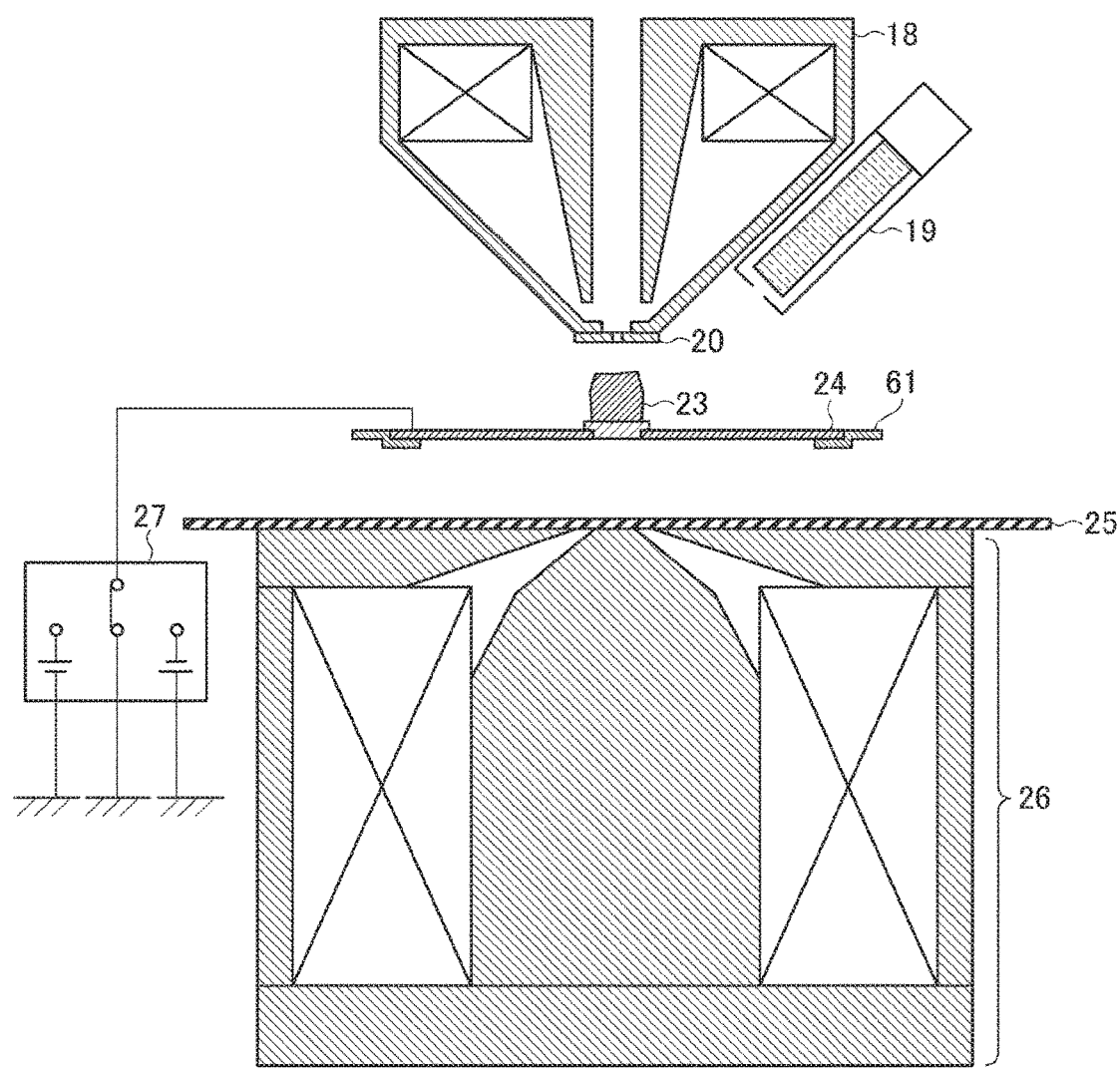
FIG. 2 is a cross-sectional view of an SEM of Embodiment 1 of the present invention, the view schematically illustrating a case involving use of a first objective lens to detect backscattered electrons and secondary electrons.

FIG. 2 illustrates an example of how the first objective lens 18 is used for focusing a primary electron beam 12 onto a sample 23. A thick sample 23, in particular, is observed by this method.

On the other hand, in a case where the second objective lens 26 is used mainly, a primary electron beam 12 having passed through the first objective lens 18 is focused so as to be reduced. The second objective lens 26 has a magnetic field distributed in such a manner that the magnetic field is stronger at a position closer to the sample 23 (see (b) of FIG. 4), and is thus a low-aberration lens. The first objective lens 18 is used to (i) control the aperture angle α for a more easily visible image and (ii) adjust the reduction ratio, the shape of the lens, and the depth of focus. The first objective lens 18 is used, in other words, to optimize the individual control values. Further, in a case where a primary electron beam 12 cannot be focused with use of only the second objective lens 26, the first objective lens 18 may be used to aid in the focusing of the primary electron beam 12.

Figure 3:
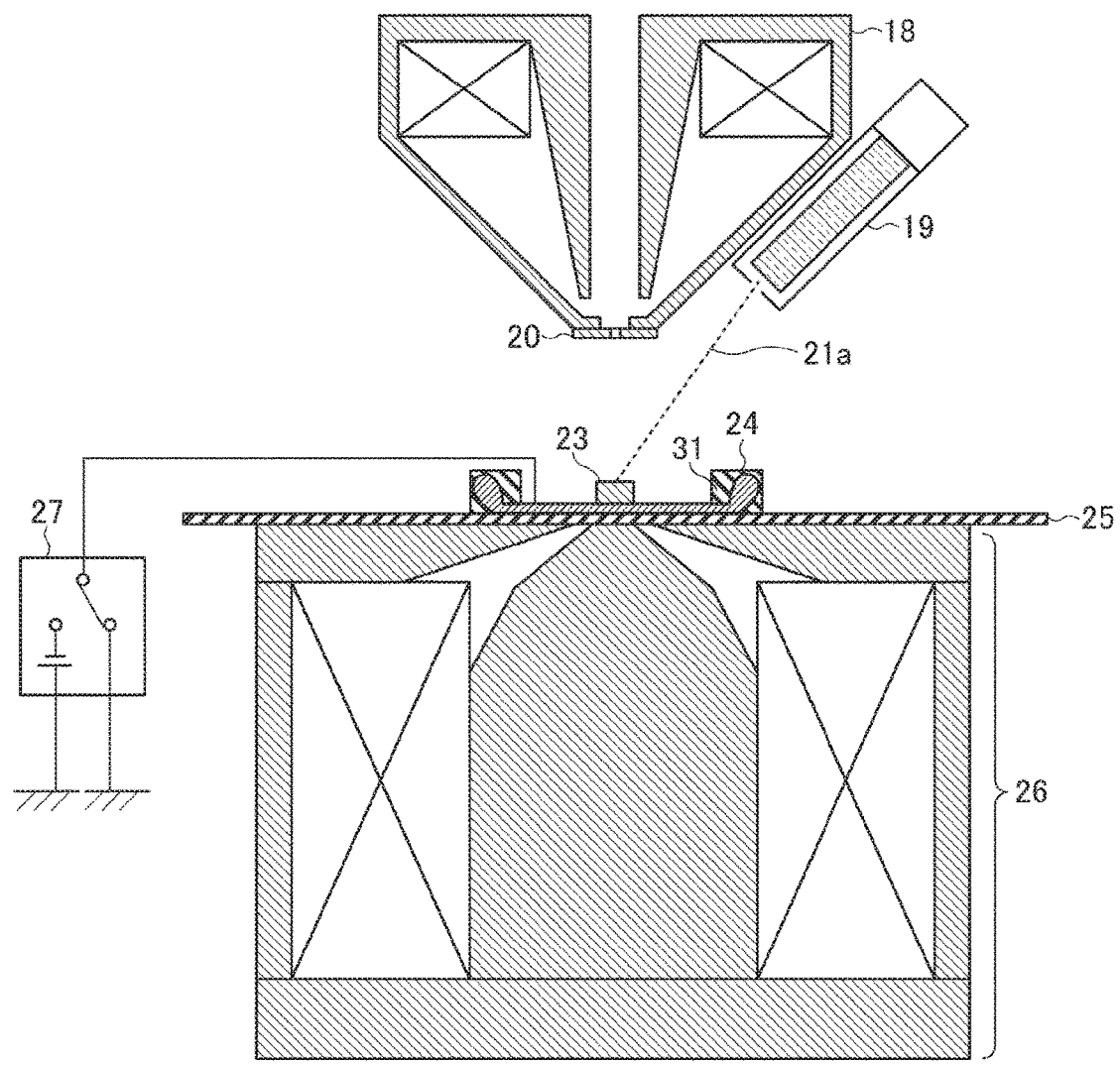
FIG. 3 is a cross-sectional view of an SEM of Embodiment 1 of the present invention, the view schematically illustrating a case involving use of a second objective lens for most focusing to detect secondary electrons.

With reference to FIG. 3, the description below deals with how the SEM operates in a case where it does not carry out retarding.

In a case where the SEM does not carry out retarding, the electric potential plate 22 shown in FIG. 1 may be removed. A sample 23 is placed desirably as closely as possible to the second objective lens 26. More specifically, a sample 23 is placed preferably closely to an upper portion (upper surface) of the second objective lens 26 in such a manner that the sample 23 is separated from the upper portion of the second objective lens 26 by a distance of not more than 5 mm.

The primary electron beam 12 having the energy accelerated by the acceleration electric power source 14 scans the sample 23. During this operation, secondary electrons 21a spiral upward around a magnetic flux due to the magnetic field of the second objective lens 26. As the secondary electrons 21a have been away from the surface of the sample 23, they stop spiraling and diverge as a result of a sharp decrease in the magnetic flux density. The secondary electrons 21a are then deflected by an attracting electric field of a secondary electron detector 19 and captured by the secondary electron detector 19. The secondary electron detector 19 is, in other words, placed in such a manner that the secondary electron detector 19 generates an electric field that attracts secondary electrons emitted from a sample in response to a charged particle beam. This allows a large number of secondary electrons 21a to enter the secondary electron detector 19.

Figure 4:
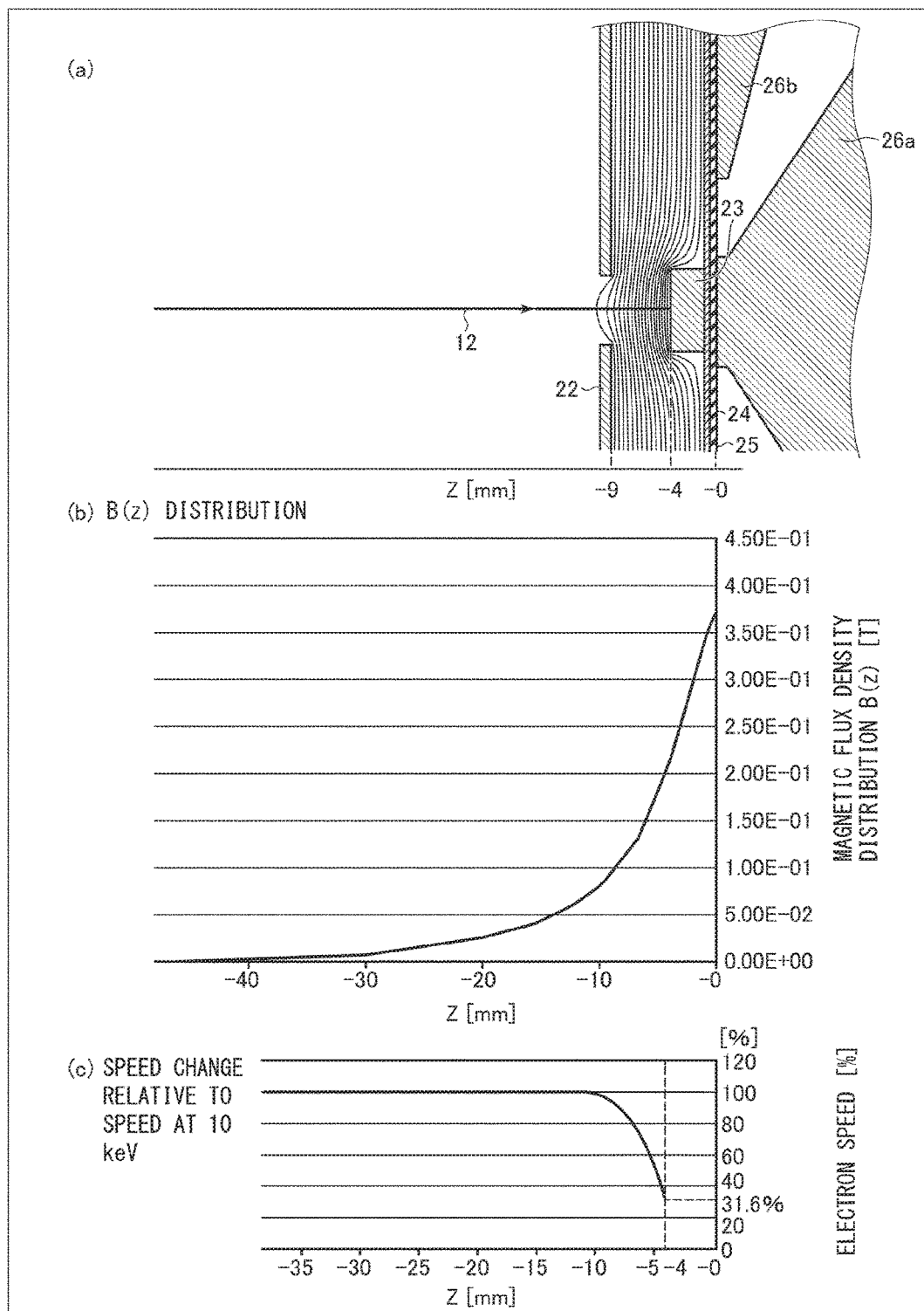
FIG. 4 shows a diagram and graphs each for description of a lens unit during retarding in Embodiment 1 of the present invention, where (a) is a diagram illustrating equipotential lines during retarding, (b) is a graph of a magnetic flux density distribution B(z) of a second objective lens along the optical axis, and (c) is a graph of the speed of a charged particle during retarding.

With reference to FIG. 4, the description below outlines how the SEM operates in a case where it carries out retarding. In FIG. 4, (a) shows equipotential lines during retarding, (b) shows a magnetic flux density distribution B(z) of a second objective lens along the optical axis, and (c) shows the speed of a charged particle during retarding.

As illustrated in (b) of FIG. 4, the second objective lens 26 has a magnetic flux density along the optical axis which magnetic flux density is distributed in such a pattern as to be higher at a position closer to the sample, and is thus a low-aberration lens. Supplying a negative electric potential to the sample 23 causes the primary electron beam 12 to decelerate more as the primary electron beam 12 becomes closer to the sample 23 (see (c) of FIG. 4). Since a slower primary electron beam 12 is influenced more by a magnetic field, the second objective lens 26 may be regarded as a lens having an intensity higher at a position closer to the sample 23. Supplying a negative electric potential to the sample 23 thus causes the second objective lens 26 to have a lower aberration.

Signal electrons 21 are accelerated by the electric field caused by a retarding voltage applied to the sample 23, and enter the detector 20 with amplified energy. The detector 20 thus has a high sensitivity. This configuration makes it possible to provide an electron beam device having a high resolution.

The first objective lens 18 and the second objective lens 26 are separated from each other by a distance within a range of 10 mm to 200 mm. The distance is preferably within a range of 30 mm to 50 mm. If the first objective lens 18 and the second objective lens 26 are separated from each other by a distance smaller than 10 mm, a detector 20 placed immediately below the first objective lens 18 may be capable of detecting backscattered electrons 21b, but secondary electrons 21a will be more likely to enter the first objective lens 18 during retarding. In a case where the first objective lens 18 and the second objective lens 26 are separated from each other by a distance of not less than 10 mm, secondary electrons 21a are more likely to be detected by the detector 20. In a case where the first objective lens 18 and the second objective lens 26 are separated from each other by a distance of approximately 30 mm, a sample 23 can be placed and removed very easily.

The following description will discuss the respective configurations of the individual components in detail. With reference to FIG. 1, the description below first deals with how the second objective lens 26 is shaped.

The second objective lens 26 includes the following magnetic poles: a central magnetic pole 26a having a central axis coinciding with an ideal optical axis of the primary electron beam 12; an upper magnetic pole 26b; a side-surface magnetic pole 26c in a cylindrical shape; and a lower magnetic pole 26d. The central magnetic pole 26a is so shaped as to have a diameter that is smaller at a position further above. The central magnetic pole 26a has an upper portion in the shape of, for example, a truncated cone having one or two stages. The central magnetic pole 26a has a lower portion in the shape of a column. The lower portion of the central magnetic pole 26a has no through hole along the central axis. The upper magnetic pole 26b is in the shape of a disk that is tapered to its center and that is thinner at a position closer to the center of gravity of the central magnetic pole 26a. The upper magnetic pole 26b has an opening at its center which opening has an opening diameter d. The central magnetic pole 26a has a tip diameter D of larger than 6 mm and smaller than 14 mm. The opening diameter d and the tip diameter D have the following relation: $d-D \geq 4$ mm.

The description below deals with specific examples of magnetic poles. The central magnetic pole 26a and the upper magnetic pole 26b have respective upper surfaces (on the sample side) that have an equal height. The lower portion of the central magnetic pole 26a has an outer diameter of 60 mm. If the outer diameter is excessively small, the central magnetic pole 26a will undesirably have a decreased magnetic permeability.

In a case where the central magnetic pole 26a has a tip diameter D of 8 mm, the upper magnetic pole 26b preferably has an opening diameter d within a range of 12 mm to 32 mm. The opening diameter d is more preferably within a range of 14 mm to 24 mm. A larger opening diameter d is advantageous in that it allows the magnetic flux density distribution along the optical axis to have a gentler peak and a wider range, which can in turn reduce the number of ampere-turns (AT, the product of the number N[T] of coil turns and the current I[A]) necessary to focus a primary electron beam 12. If, however, the opening diameter d and the tip diameter D have the relation d>4D, the second objective lens 26 will have a large aberration coefficient. In Embodiment 1, the upper magnetic pole 26b has an opening diameter d of 20 mm, and the side-surface magnetic pole 26c has an outer diameter of 150 mm. The central magnetic pole 26a may have a through hole at the axis center.

In a case where, for instance, a primary electron beam 12 is to be focused onto a sample 23 having a thickness of 5 mm even with use of a high accelerating voltage of 30 kV, the tip diameter D is preferably larger than 6 mm and smaller than 14 mm. If D is excessively small, the magnetic pole will be saturated, with the result of a failure to focus the primary electron beam 12. If D is excessively large, on the other hand, the SEM will have a poor performance. Further, if the size difference between d and D is smaller than 4 mm, the central magnetic pole 26a and upper magnetic pole 26b will be excessively close to each other and more likely to be saturated, with the result of a failure to focus the primary electron beam 12. In addition, if the first objective lens 18 and the second objective lens 26 are separated from each other by a distance of not more than 10 mm, the SEM will have a poor workability. If this distance is larger than 200 mm, the aperture angle α will be excessively large. This case will require adjusting α to a smaller angle with use of the first objective lens 18 for an optimal aberration, with the result of a poor operability.

In a case where, for instance, the accelerating voltage is limited to not more than 5 kV and the sample 23 has a small thickness, the tip diameter D may be not more than 6 mm. If, for instance, (i) the accelerating voltage is 5 kV, (ii) D is 2 mm, (iii) d is 5 mm, and (iv) the sample 23 has a thickness of 5 mm, using only the second objective lens 26 will unfortunately cause the magnetic poles to be saturated, with the result of a failure to focus the primary electron beam 12. However, in a case where the sample 23 is limited in terms of thickness, the second objective lens 26 can provide a higher performance.

The sample 23 may be supplied with an electric potential by a method of (i) inserting an electric insulator between magnetic poles of the second objective lens 26 to allow a magnetic pole(s) to be separated from the ground potential and (ii) applying a retarding voltage to the sample 23 and that magnetic pole(s). In this case, a non-magnetic material in the magnetic circuit will decrease the intensity of the magnetic lens. Further, a higher retarding voltage will cause an electric discharge. A thicker electric insulator will undesirably further decrease the intensity of the magnetic lens.

As illustrated in FIG. 1, the second objective lens 26 is desirably provided with a sealing section 26f made of a non-magnetic material (for example, copper, aluminum, or Monel) and disposed between the upper magnetic pole 26b and the central magnetic pole 26a. The sealing section 26f is an O ring or formed by brazing for vacuum-sealing the space between the upper magnetic pole 26b and the central magnetic pole 26a. The second objective lens 26 is configured such that the upper magnetic pole 26b, the sealing section 26f, and the central magnetic pole 26a achieve an airtight separation of a vacuum side and an air side from each other. The upper magnetic pole 26b is joined with a vacuum container with use of an O ring for airtightness (not shown in FIG. 1). This configuration allows the second objective lens 26 to be entirely exposed to air except for the surface on the vacuum side, thereby making it possible to easily cool the second objective lens 26.

The second objective lens 26 may be placed in the vacuum container, but the degree of vacuum will be lower in that case. This is because a coil section 26e on the vacuum side will be an outgas source. Without an airtight separation of the vacuum side and the air side from each other as above, vacuuming will cause gas to pass through the space between the second objective lens 26 and an insulating sheet 25, undesirably causing the sample to move.

The coil section 26e can have a coil current of, for example, 6000 AT. If a coil has been heated to a high temperature, that high temperature may melt the coating of the winding and consequently cause a short circuit. Allowing the second objective lens 26 to be exposed to air increases the cooling efficiency. Preparing, for example, an aluminum base on which to place the second objective lens 26 allows that base to be used as a heat sink. Further, the second objective lens 26 can be cooled with use of a cooling fan, water, or the like. The airtight separation allows the second objective lens 26 to be strongly excited.

With reference to FIG. 1, the description below deals with a retarding section.

An insulating sheet 25 is placed on the second objective lens 26. The insulating sheet 25 is, for example, a polyimide film or polyester film having a thickness within a range of approximately 0.1 mm to 0.5 mm. On the insulating sheet 25, a sample stage 24 is placed that is not magnetic and that is electrically conductive. The sample stage 24 is, for example, an aluminum plate having (i) a bottom part with a thickness of 250 μm and (ii) a peripheral part processed to have a surface curved in such a manner that a portion closer to the peripheral edge is more apart from the insulating sheet 25. The sample stage 24 may also be provided with an insulating material 31 filling the gap between the curved-surface portion and the insulating sheet 25. This can increase the withstand voltage between the second objective lens 26 and the sample stage 24 for stable use. The sample stage 24 has a circular planar shape. The sample stage 24 may, however, alternatively have any other planar shape such as an ellipse or a rectangle.

On the sample stage 24, a sample 23 is placed. The sample stage 24 is connected to a retarding electric power source 27 to apply a retarding voltage to the sample 23. The electric power source 27 is, for example, an electric power source that has a variable output and that is capable of applying a voltage of 0 V to −30 kV. The sample stage 24 is, for movement from outside the vacuum container, connected to a sample stage plate 29 made of an insulating substance. This makes it possible to change the position of the sample 23. The sample stage plate 29 is connected to an XY stage (not shown in FIG. 1) for movement from outside the vacuum container.

Above the sample 23, an electrically conductive plate (hereinafter referred to as "electric potential plate 22") is placed that has a circular opening. The electric potential plate 22 is oriented so as to be perpendicular to the optical axis of the second objective lens 26. The electric potential plate 22 is separated from the sample 23 in an insulating manner. The electric potential plate 22 is connected to an electric potential plate electric power source 28. The electric potential plate electric power source 28 is, for example, an electric power source that has a variable output and that is capable of applying a voltage of 0 V and −10 kV to 10 kV. The circular opening of the electric potential plate 22 has a diameter of approximately 2 mm to 20 mm. The diameter of the opening is preferably within a range of 4 mm to 12 mm. The electric potential plate 22 may alternatively have an electrically conductive mesh-like portion through which a primary electron beam 12 or signal electrons 21 pass. The mesh is preferably so fine as to allow electrons to pass therethrough easily for an increased open area ratio. The electric potential plate 22 is connected to an XYZ stage 61 so as to be moved from outside the vacuum container for adjustment of the central axis. The XYZ stage 61 is intended to support the electric potential plate 22 and enable movement of the electric potential plate 22 in the X, Y, and Z directions.

The peripheral part of the sample stage 24 protrudes in the thickness direction toward the electric potential plate 22. If, for instance, the electric potential plate 22 is flat, it will be close to the sample stage 24 at the peripheral part of the sample stage 24. This will make an electric discharge more likely to occur. The electric potential plate 22 is shaped in such a manner that any portion thereof other than a portion close to the sample 23 is more apart from the electrically conductive sample stage 24. This can increase the withstand voltage between the electric potential plate 22 and the sample stage 24.

The electric potential plate 22 is separated from the sample 23 by a distance of approximately 1 mm to 15 mm for prevention of electric discharge. The electric potential plate 22 should, however, not be excessively separated from the sample 23. This is in order for a retarding electric field to be at a position where the magnetic field of the second objective lens 26 is intense. If the electric potential plate 22 is far away from the sample 23, or if the electric potential plate 22 is absent, the primary electron beam 12 will decelerate before being focused by the second objective lens 26, with the result that the effect of decreasing the aberration will be reduced.

The description below deals with that with reference to FIG. 4. FIG. 4 shows explanatory diagram and graphs corresponding to simulation data 4 described later. (a) of FIG. 4 is a diagram illustrating equipotential lines during retarding.

If the opening of the electric potential plate 22 is excessively large, and the sample 23 and the electric potential plate 22 are excessively close to each other, the equipotential lines will be distributed in such a pattern as to lie largely on the electron gun side beyond the opening of the electric potential plate 22. In this case, primary electrons may decelerate before reaching the electric potential plate 22. The electric potential plate 22 having an opening with a smaller diameter reduces that portion of an electric field which lies beyond the opening. The electric potential plate 22 needs to be configured not to absorb signal electrons 21. This means not only that the electric potential difference between the sample 23 and the electric potential plate 22 should be adjusted so that no electric discharge occurs, but also that (i) the distance between the sample 23 and the electric potential plate 22 should be adjusted and (ii) the diameter of the opening of the electric potential plate 22 should be selected appropriately.

(b) of FIG. 4 is a graph illustrating the magnetic flux density distribution B(z) of the second objective lens 26 along the optical axis. The graph has a vertical axis indicative of B(z), a horizontal axis indicative of the coordinates, and an origin point (−0) indicative of the surface of the second objective lens 26. The graph shows a sharper increase in B(z) for a portion closer to the second objective lens 26.

(c) of FIG. 4 is a graph illustrating the speed of a charged particle during retarding. The graph shows that a charged particle beam decelerates immediately before reaching a sample.

Placing the electric potential plate 22 near the sample 23 does not change the speed of primary electrons very much before they become close to the electric potential plate 22, and decelerates the primary electrons as they travel from near the electric potential plate 22 toward the sample 23, thereby rendering the primary electrons more likely to be influenced by a magnetic field. Since the second objective lens 26 also causes a magnetic field that is more intense at a position closer to the sample 23, the respective effects of the two magnetic fields combine to provide a low-aberration lens that is even more intense at a position closer to the sample 23.

Maximizing the accelerating voltage while causing the retarding voltage to be close to the accelerating voltage can reduce the illumination electron energy so that electrons entering a sample 23 reach a smaller depth. This in turn makes it possible to observe the shape of the surface of a sample at a high resolution. The above arrangement, which can also achieve a low aberration, makes it possible to provide a high-resolution, low-voltage SEM.

Embodiment 1 allows the withstand voltage between the sample 23 and the electric potential plate 22 to be increased easily. The first objective lens 18 and the second objective lens 26 can be separated from each other by a distance of 10 mm to 200 mm. Thus, in a case where, for instance, the sample 23 is flat, and the sample 23 and the electric potential plate 22 are separated from each other by a gap of approximately 5 mm, an electric potential difference of approximately 10 kV can be supplied to the sample 23 and the electric potential plate 22 relatively easily. In a case where the sample 23 has a pointed portion, the distance and opening diameter, for example, need to be selected appropriately for prevention of electric discharge.

Figure 5:
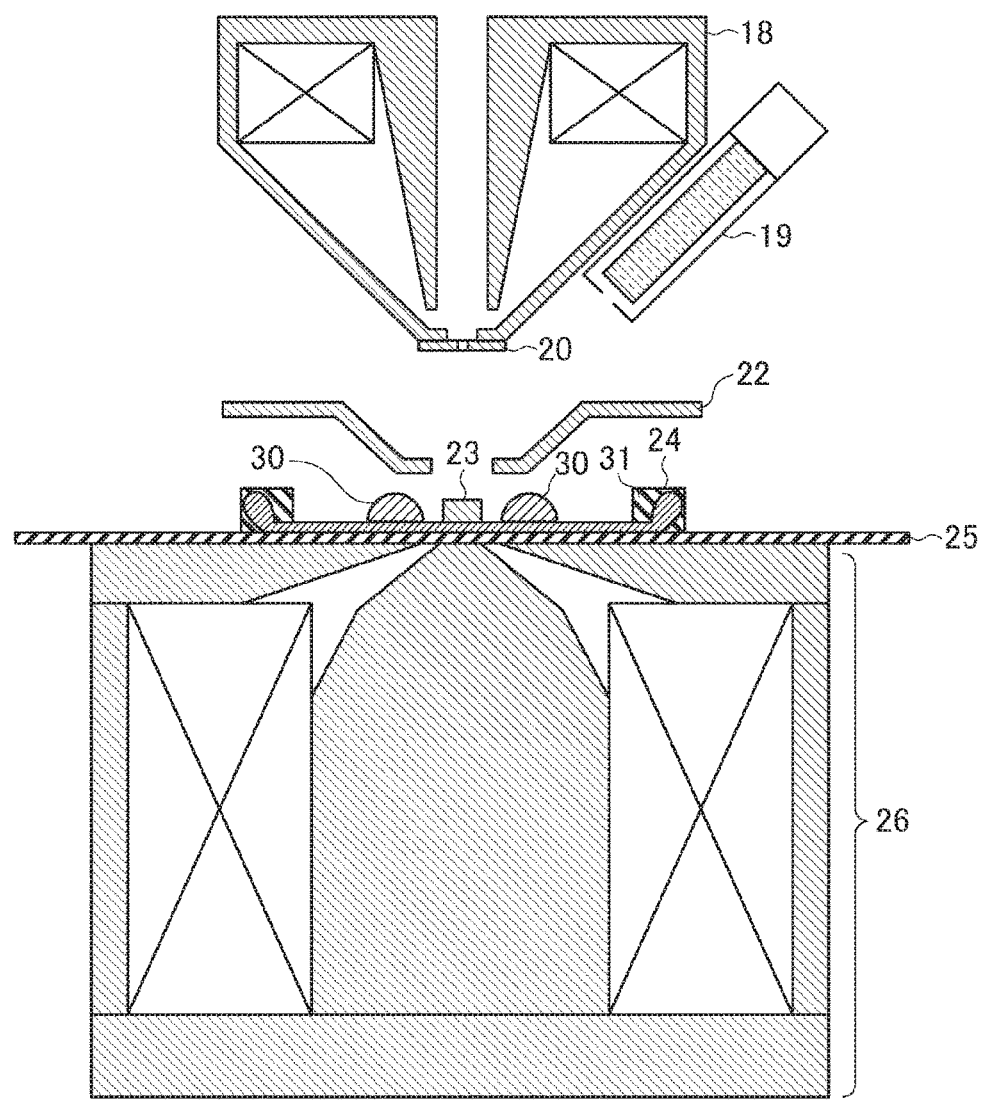
FIG. 5 is a cross-sectional view of an SEM, the view schematically illustrating an insulating unit and sample stage that are configured differently from an insulating unit and sample stage of Embodiment 1 of the present invention.

FIG. 5 illustrates a different example of how a sample is placed. As illustrated in FIG. 5, a sample 23 on the sample stage 24 is preferably surrounded by an electric discharge preventing cylindrical electrode 30, which has a cylindrical shape and which has a rounded upper surface. The electric discharge preventing cylindrical electrode 30 also serves to smooth equipotential lines across a sample and alleviate displacement of a focused point which displacement is due to an irregular shape of a sample 23.

The detector 20 of Embodiment 1 is a semiconductor detector 20, a micro-channel plate detector 20 (MCP), or a Robinson detector 20 of a fluorescent material emission type. At least one of those detectors is placed immediately below the first objective lens 18. The secondary electron detector 19 is, in order to collect secondary electrons 21a, placed so as to cause an electric field that spreads over a space above the sample 23.

The semiconductor detector 20, the MCP detector 20, or the Robinson detector 20 is in contact with that surface of the first objective lens 18 which is on the sample side, and is positioned not more than 3 cm away from the optical axis. The detector 20 preferably includes a detecting section having (i) a center on the optical axis and (ii) an opening at the center through which opening primary electrons pass. The detector is positioned not more than 3 cm away from the optical axis because in a case where retarding is carried out, signal electrons travel to the vicinity of the optical axis.

The primary electron beam 12 scans the sample 23 with use of the energy calculated by multiplying −(Vacc−Vdecel) [V] by the electron charge, where −(Vacc−Vdecel) refers to the difference between (i) the accelerating voltage used by the acceleration electric power source 14 (Vacc) for acceleration and (ii) the retarding voltage Vdecel. During the scanning operation, the sample 23 emits signal electrons 21. The respective values of the accelerating voltage and retarding voltage determine how electrons are influenced. Backscattered electrons 21b are subjected by the magnetic field of the second objective lens 26 to force that cause the backscattered electrons 21b to spin, and are simultaneously accelerated by the electric field between the sample 23 and the electric potential plate 22. This narrows the angle of radiation of the backscattered electrons 21b, and facilitates the entry into the detector 20. Secondary electrons 21a are also subjected by the magnetic field of the second objective lens 26 to force that cause the secondary electrons 21a to spin, and are simultaneously accelerated by the electric field between the sample 23 and the electric potential plate 22. The secondary electrons 21a then enter the detector 20, which lies below the first objective lens 18. Both secondary electrons 21a and backscattered electrons 21b are accelerated to have amplified energy before entering the detector 20. This allows large signals.

A general-purpose SEM typically uses a lens similar to the first objective lens 18 to focus electrons. Such a lens is typically designed so as to have a higher resolution as a sample 23 is closer to the first objective lens 18. The sample 23, however, needs to be separated from the first objective lens 18 by a distance corresponding to the thickness of the semiconductor detector 20 or the like. If a sample 23 is excessively close to the first objective lens 18, secondary electrons 21a will be less likely to enter the secondary electron detector 19, which lies outside the first objective lens 18. A general-purpose SEM thus includes a thin semiconductor detector 20 disposed immediately below the first objective lens 18 and having an opening through which primary electrons pass. A sample 23 is placed in such a manner as to be separated from the detector 20 by a slight gap for prevention of contact. This unfortunately causes the sample 23 and the first objective lens 18 to be separated from each other by a small distance, making it difficult to achieve a high performance.

Embodiment 1 is configured such that (i) in a case where the second objective lens 26 is used as a main lens, a sample 23 can be close to the second objective lens 26 and that (ii) the first objective lens 18 and the second objective lens 26 can be far from each other. In a case where, for instance, the first objective lens 18 and the second objective lens 26 are apart from each other by a distance of 30 mm, an MCP detector 20 having a thickness of approximately 10 mm can be disposed immediately below the first objective lens 18. Alternatively, a Robinson detector 20 or semiconductor detector 20 may of course be placed instead of such an MCP detector 20. Embodiment 1 may alternatively include a reflector plate and be configured such that signal electrons 21 are caused to be incident on the reflector plate and that the secondary electron detector detect electrons generated or reflected by the reflector plate. Embodiment 1 can use any of various signal electron detectors 20 each having a function equivalent to the above.

The description below deals with the aperture angle α, which is related to the performance of a lens optical system.

The beam diameter of a primary electron beam 12 incident on a sample 23 is called probe diameter. The probe diameter is evaluated in accordance with the formulae below. In each formula below, the number following the ˆ sign is an exponent.

$$\text{Probe diameter } D\text{probe}=\text{sqrt}[Dg^2+Ds^2+Dc^2+Dd^2] \text{ [nm]} \qquad \text{[Math. 1]}$$

$$\text{Reduced diameter of light source } Dg=M1\cdot M2\cdot M3\cdot So=M\cdot So \text{ [nm]} \qquad \text{[Math. 2]}$$

$$\text{Spherical aberration } Ds=0.5Cs\cdot\alpha^3 \text{ [nm]} \qquad \text{[Math. 3]}$$

$$\text{Chromatic aberration } Dc=0.5Cc\cdot\alpha\cdot\Delta V/Vi \text{ [nm]} \qquad \text{[Math. 4]}$$

$$\text{Diffraction aberration } Dd=0.75\times 1.22\times\text{Lambda}/\alpha \text{ [nm]} \qquad \text{[Math. 5]}$$

In the formulae above, So represents the size of the electron source, M1 represents the reduction ratio of the first-stage condensing lens 15a, M2 represents the reduction ratio of the second-stage condensing lens 15b, M3 respective the reduction ratio of the lens unit consisting of the first objective lens 18 and the second objective lens 26, M represents the total reduction ratio (=M1×M2×M3), Cs represents the spherical aberration coefficient, Cc represents the chromatic aberration coefficient, α represents the aperture angle of a primary electron beam 12 on a sample surface, Vi represents the incident voltage (that is, a voltage corresponding to the energy with which a primary electron collides with a sample 23), ΔV represents a voltage corresponding to the energy spread of a primary electron beam 12, and Lambda represents the wavelength of an electron.

With reference to simulation data, the description below deals with an example of the performance of an SEM including an electron source of the thermoelectronic emission type. The example below assumes that the first objective lens 18 illustrated in FIG. 1 is of an out-lens type.

The description below deals with a case where the first objective lens 18 is used to focus a primary electron beam 12. This arrangement corresponds to a general-purpose SEM.

This case assumes that ΔV of the primary electron beam 12 is 1 V, that the size So of the electron source is μm, and that M1×M2=0.00282. The SEM is provided with an objective-lens aperture 16 having a bore diameter of 30 μm for removal of electrons in unnecessary trajectories. Selecting a bore diameter for the objective-lens aperture 16 allows adjustment of the aperture angle α and probe current of a beam incident on a sample 23. The case also assumes that WD is 6 mm and that the accelerating voltage Vacc=−30 kV (Vi=30 kV). The above conditions are simulated for calculation to produce the following results:

(Simulation Data 1)
Dprobe=4.4 nm, Dg=1.59, Ds=3.81, Dc=0.916, Dd=1.25, Cs=54.5 mm, Cc=10.6 mm, α=5.19 mrad, M3=0.0575

The description below deals with a case where the second objective lens 26 is used to focus a primary electron beam 12.

This case assumes that in FIG. 1, the second objective lens 26 is separated from the first objective lens 18 by a distance of 40 mm. The case also assumes that the second objective lens 26 is configured such that D=8 mm and d=20 mm and that the objective-lens aperture 16 has a bore diameter of 21.8 microns for adjustment of α. In this case, the condensing lens unit 15 is adjusted to a lower intensity so that the amount of the probe current remains unchanged from that for a general-purpose SEM, while the other conditions are the same as for a general-purpose SEM. The above conditions are simulated for the position Z=−4 mm to produce the following performance results:

(Simulation Data 2)

Dprobe=1.44 nm, Dg=0.928, Ds=0.657, Dc=0.503, Dd=0.729,

Cs=1.87 mm, Cc=3.391 mm, α=8.89 mrad, M3=0.0249

The above data indicates that the use of the second objective lens 26 significantly improves the performance of an SEM.

The data also shows that Dg is smaller in the case where the second objective lens 26 is used to focus a primary electron beam 12 than in the case where the first objective lens 18 is used to focus a primary electron beam 12. This indicates that for a similar probe diameter, the condensing lens unit 15 can have a lower intensity in the case where the second objective lens 26 is used to focus a primary electron beam 12 than in the case where the first objective lens 18 is used to focus a primary electron beam 12. This in turn indicates that the use of the second objective lens 26 allows the probe current to be larger than in the case of a general-purpose SEM.

The description below deals with a case where the first objective lens 18 is not used, the second objective lens 26 is used, and the accelerating voltage Vacc is −1 kV (Vi=1 kV) (with the retarding voltage of 0 V). The condensing lens unit 15 is adjusted so that the probe current remains unchanged (the respective trajectories of electrons from the electron gun and the amount of beams are the same as in the case where the accelerating voltage is −30 kV), while the other conditions are the same as for a general-purpose SEM.

The above conditions are simulated to produce the following data:

(Simulation Data 3)

Figure 6:
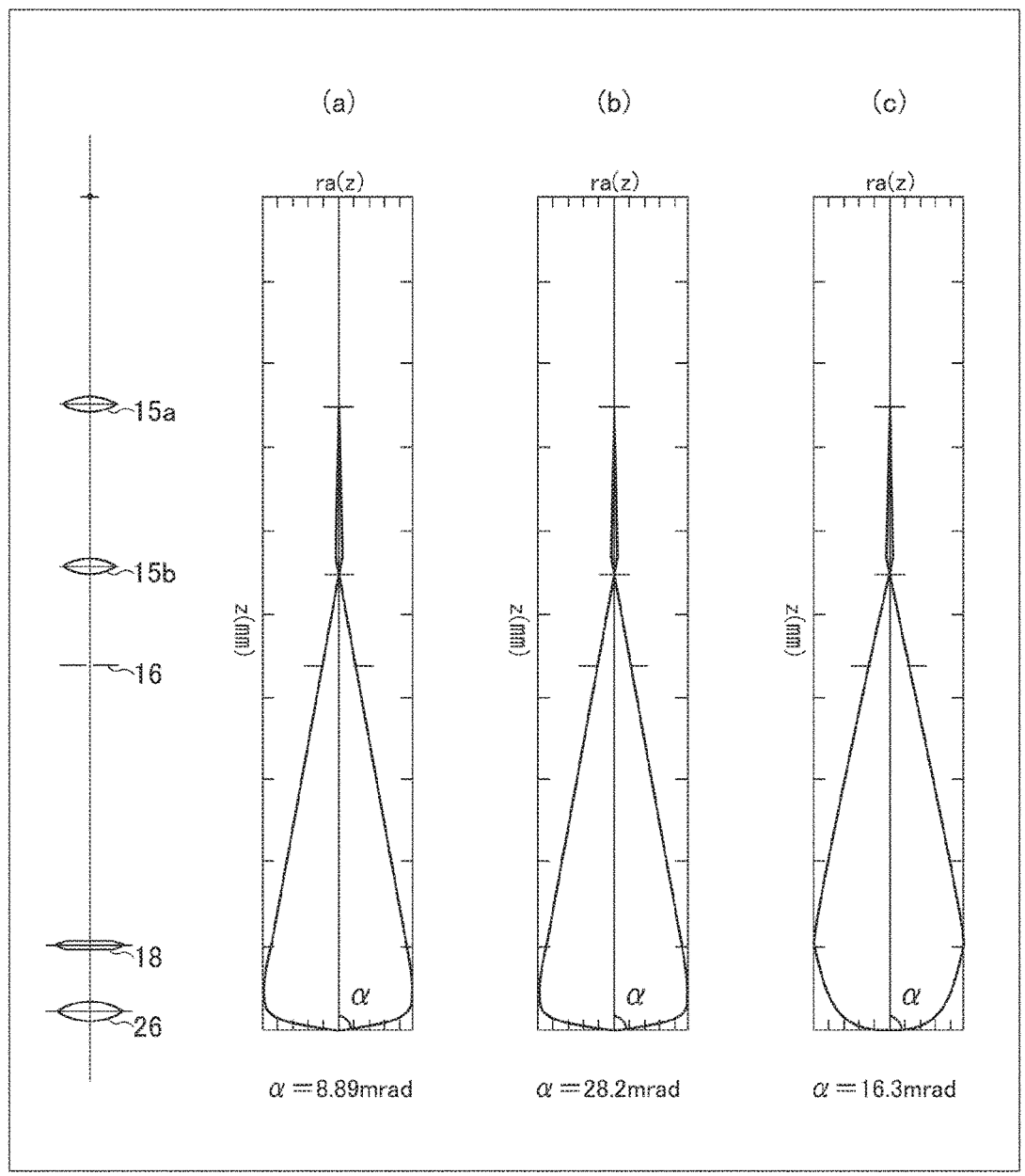
FIG. 6 shows diagrams each for description of adjustment of the aperture angle α with use of a first objective lens of Embodiment 1 of the present invention, where (a) is a diagram corresponding to simulation data (Vacc=−1 kV), (b) is a diagram corresponding to simulation data 4 (Vacc=−10 kV, Vdecel=−9 kV), and (c) is a diagram corresponding to simulation data 5 (Vacc=−10 kV, Vdecel=−9 kV; first objective lens used).

(a) of FIG. 6 shows the results.

Dprobe=15.6 nm, Dg=0.928, Ds=0.657, Dc=15.1, Dd=3.99,

Cs=1.87 mm, Cc=3.39 mm, α=8.89 mrad, M3=0.0249

In this simulation, Cs, Cc, α, M3, and Ds are equal to those in the simulation data 2. Since ΔV/Vi is large, the probe diameter is remarkably large.

The description below deals with an example in which the electric potential plate 22 is disposed above a sample 23. The electric potential plate 22 has an opening diameter of Φ=5 mm, and the sample 23 has a diameter of Φ=6 mm. The sample has a measurement surface at Z=−4 mm (which is the distance from the second objective lens 26). The sample stage 24 is separated from the electric potential plate 22 by a distance of 8 mm. The sample measurement surface is separated from the electric potential plate 22 by a distance of 5 mm.

The following conditions are simulated: the accelerating voltage Vacc is −10 kV, the electric potential plate 22 has an electric potential of 0 V, the sample 23 is subjected to retarding at Vdecel=−9 kV, and Vi=1 kV. This simulation does not use the first objective lens 18, and uses only the second objective lens 26 to focus a primary electron beam 12.

(Simulation Data 4)

(b) of FIG. 6 shows the results.

Dprobe=5.72 nm, Dg=0.924, Ds=2.93, Dc=4.66, Dd=1.26,

Cs=0.260 mm, Cc=0.330 mm, α=28.2 mrad, M3=0.0247

In a case where the retarding voltage Vdecel is −9 kV, illumination electrons have an energy of 1 keV. The probe diameter is greatly improved as compared to the case where the accelerating voltage is −1 kV.

The description below deals with an example in which (i) the first objective lens 18 is used in addition to the above conditions and (ii) the intensity of the first objective lens 18 is adjusted appropriately (that is, AT (ampere-turn) is approximately 0.37 times that necessary in the simulation data 1).

(Simulation Data 5)

(c) of FIG. 6 shows the results.

Dprobe=4.03 nm, Dg=1.60, Ds=0.682, Dc=2.92, Dd=2.17,

Cs=0.312 mm, Cc=0.357 mm, α=16.3 mrad, M3=0.0430

The above data shows that Dprobe is decreased. In the simulation data 4, Dc (=4.66) is significantly large as compared to the other conditions. In view of that, a mere use of the first objective lens 18 can reduce α. [Math. 4] above indicates that Dc depends on Cc and α. Cc is increased a little, whereas α is considerably decreased. Dc is decreased as a result. [Math. 1] above indicates that the use of the first objective lens 18 can reduce Dprobe.

In (a) of FIG. 6, α=8.89 mrad, whereas in (b) of FIG. 6, α=28.2 mrad, which is a large value resulting from retarding. This indicates that the lens is intense and that Dd is small as a result. In (c) of FIG. 6, the first objective lens 18 is used for adjustment of α, with the result of a small α value.

It should be noted that while the objective-lens aperture 16 may have a smaller bore diameter for adjustment of α, that will unfortunately decrease the probe current. Using the first objective lens 18 for adjustment of α, on the other hand, does not decrease the probe current, which in turn prevents a decrease in the number of secondary electrons 21a or backscattered electrons 21b generated by the sample 23.

Applying a retarding voltage for an increase in the sensitivity of the detector 20 allows (i) the probe current to be reduced, (ii) the bore diameter of the objective-lens aperture 16 to be smaller for a smaller α value, and (iii) the reduction ratio M1×M2 of the condensing lens unit 15 to be smaller. This may in turn allow the probe diameter to be even smaller (which will involve adjustment in relation to Dg, Ds, Dc, and Dd). The objective-lens aperture 16 and the first objective lens 18 can be used for optimization of the probe diameter.

A lens with a smaller depth of focus may merely be adjustable to have a focus on only either the upper surface or bottom surface of irregularities of a sample 23. In such a case, a smaller α value for a given probe diameter allows a larger depth of focus for a possibly clearer image. The first objective lens 18 may alternatively be used to optimize the focus for a easily visible image.

The description below deals with specific examples of various uses of the device of Embodiment 1.

(b) of FIG. 6 is of a simulation in which the accelerating voltage Vacc is −10 kV and the sample 23 is subjected to retarding at −9 kV. The conditions may, however, vary such that, for instance, the accelerating voltage Vacc is −4 kV and the sample 23 is subjected to retarding at −3.9 kV for Vi=100V. The ratio being closer to 1 between the accelerating voltage and the retarding voltage allows the aberration coefficient to be smaller. The description above deals with a case where the magnetic poles of the second objective lens 26 are arranged such that D=8 mm and d=20 mm. In a case where, for example, D=2 mm and d=6 mm, although the height of a sample, the accelerating voltage, and the like are each limited in terms of the range of possible values, the SEM has a higher performance.

In a case where the accelerating voltage is −10 kV and retarding is not carried out, the secondary electron detector 19 can detect secondary electrons 21a, but the semiconductor detector 20 cannot. In a case where the accelerating voltage is −20 kV and the retarding voltage is −10 kV, approximately 10 keV of energy causes secondary electrons 21a to enter the semiconductor detector 20, allowing the semiconductor detector 20 to detect secondary electrons 21a.

In a case where the accelerating voltage is −10.5 kV and the retarding voltage is −0.5 kV, the semiconductor detector 20 cannot detect secondary electrons 21a with a high sensitivity. In this case, however, the secondary electron detector 19 can detect secondary electrons 21a. In other words, secondary electrons 21a can be captured by the secondary electron detector 19 in a case where the retarding voltage is low, whereas secondary electrons 21a can be detected by the semiconductor detector 20 in a larger amount in a case where the retarding voltage is gradually increased. As described above, the secondary electron detector 19 also serves in adjustment to raise the retarding voltage while maintaining the focus.

The second objective lens 26 of Embodiment 1 is designed to be capable of focusing 30 keV of primary electrons at Z=−4.5 mm. In a case where the sample is closer to the second objective lens 26, for example, at Z=−0.5 mm, the second objective lens 26 is capable of focusing even 100 keV of primary electrons. In a case where retarding is not carried out, the insulating sheet (insulating film) may be absent above the second objective lens 26. Thus, the second objective lens 26 is, in this case, sufficiently capable of focusing a primary electron beam 12 accelerated at an accelerating voltage of −100 kV. The second objective lens 26 is preferably designed to be capable of focusing, at a position 0 mm to 4.5 mm higher than that portion of magnetic poles of the second objective lens 26 closest to the sample, a charged particle beam accelerated by an acceleration electric power source set at a voltage within a range of −30 kV to −10 kV.

The description below deals with a case where the accelerating voltage is −15 kV, a voltage of −5 kV is applied to the sample 23, and a voltage of −6 kV is applied to the electric potential plate 22. Primary electrons have an energy of 10 keV when incident on the sample 23. Secondary electrons 21a emitted by the sample 23 have an energy of not more than 100 eV. Since the electric potential plate 22 has an electric potential that is 1 kV lower than the electric potential of the sample 23, secondary electrons 21a cannot travel beyond the electric potential plate 22. This makes it impossible to detect secondary electrons 21a. Backscattered electrons 21b, emitted by the sample 23 and having an energy of not less than 1 keV, can pass through the electric potential plate 22. Further, since there is an electric potential difference of 6 kV between the electric potential plate 22 and the detector 20 below the first objective lens 18, the backscattered electrons 21b are accelerated before entering the detector 20. In a case where the voltage of the electric potential plate 22 is adjustable as described above, the electric potential plate 22 is usable as an energy filter. Further, accelerating signal electrons 21 can increase the sensitivity of the SEM.

The description below deals with a case where the sample has a height of, for example, 7 mm.

In this case, measurements are made at a position Z that is, for example, approximately −7.75 mm, including the respective thicknesses of the insulating sheet 25 and the sample stage 24, from the upper magnetic pole 26b even in a case where retarding is carried out. In this case, using only the second objective lens 26 cannot focus a primary electron beam 12 having an energy of 30 keV. However, additionally using the first objective lens 18 can focus such a primary electron beam 12 even without lowering the accelerating voltage.

Using only the first objective lens 18 to focus a primary electron beam 12 may, depending on the height of the sample 23, allow observation with a higher performance (see FIG. 2). The most suitable use can be selected for each sample 23 as such.

The description above deals with a case where the first objective lens 18 and the second objective lens 26 are separated from each other by a distance of 40 mm. This distance may be fixed or changeable. An increased distance between the first objective lens 18 and the second objective lens 26 causes the reduction ratio M3 to be smaller and the aperture angle α to be larger. This method can be used to adjust α.

A high retarding voltage causes signal electrons 21 to travel near the optical axis and be more likely to enter the opening of the detector 20 through which opening primary electrons pass. The opening of the detector 20 is preferably as small as possible. The detector 20 has a high sensitivity in a case where the opening has Φ of 1 mm to 2 mm. Another method for increasing the sensitivity includes (i) adjusting the opening diameter and height of the electric potential plate 22 and (ii) shifting the electric potential plate 22 slightly from the optical axis for adjustment of the respective trajectories of signal electrons 21 so that the signal electrons 21 are incident on the detector 20. Still another method includes inserting an E-cross-B (E×B) component that causes an electric field and a magnetic field orthogonal to each other between the first objective lens 18 and the second objective lens 26 to bend the respective trajectories of signal electrons 21 slightly. Since primary electrons and signal electrons 21 travel in opposite directions, still another method includes providing a weak electric field and a weak magnetic field to bend the respective trajectories of signal electrons 21 slightly. Bending the respective trajectories of signal electrons 21 slightly prevents the signal electrons 21 from entering the opening at the center of the detector 20 and allows the signal electrons 21 to be detected. Still another method includes simply causing an electric field sideways to cross the optical axis orthogonally between the first objective lens 18 and the second objective lens 26. This method is not likely to influence primary electrons, and causes only a sideway shift, which merely causes a small influence on the image. For instance, an electric field caused by, for example, the collector electrode of the secondary electron detector 19 can be used for control of the respective trajectories of signal electrons 21.

In FIG. 3, the second objective lens 26 is used as a main lens. In a case where the sample stage 24 has a ground potential, secondary electrons 21a are detected by the secondary electron detector 19, whereas backscattered electrons 21b are detected by, for example, the semiconductor detector 20 or Robinson detector 20. In a case where the sample 23 is separated from the detector 20 by a distance within a range of approximately 10 mm to 20 mm, backscattered electrons 21b can be detected with a high sensitivity. However, in a case where the sample 23 is separated from the detector 20 by a distance of approximately 40 mm, an increased number of backscattered electrons 21b fail to enter the detector 20, with the result of a smaller amount of backscattered electrons 21b detected. Applying a retarding voltage to the sample 23 in this case allows secondary electrons 21a to be detected by, for example, the semiconductor detector 20 or Robinson detector 20. Further, applying a retarding voltage prevents backscattered electrons 21b from spreading, thereby allowing the backscattered electrons 21b to be detected by, for example, the semiconductor detector 20 or Robinson detector 20 with a high sensitivity. Retarding can be carried out even in a case where the electric potential plate 22 is absent as described above.

FIG. 2 illustrates a case where the sample 23 is thick and the first objective lens 18 is used as an objective lens. The configuration illustrated in FIG. 2 can use, as a sample stage, an XYZ stage 61 for moving the electric potential plate 22. More specifically, the sample stage 24, instead of the electric potential plate 22, is connected to the XYZ stage 61, and thereby the sample stage 24 can move in the X, Y, and Z directions. This XYZ stage 61 can move the sample stage 24 also toward the first objective lens 18. This allows the device illustrated in FIG. 2 to be used as a general-purpose SEM. Backscattered electrons 21b are detected by, for example, the semiconductor detector 20 or Robinson detector 20, whereas secondary electrons 21a are detected by the secondary electron detector 19. The sample 23 typically has a ground potential, but may alternatively be subjected to simple retarding (that is, retarding may be carried out without use of the electric potential plate 22).

It should be noted in FIG. 2 that the sample stage 24, which is connected to the XYZ stage 61, eliminates the need for the electric potential plate 22 and the sample stage plate 29 which are illustrated in FIG. 1.

In a case where only the second objective lens electric power source 42 is used, the device is configured such that the distance between the second objective lens 26 and the sample measurement surface is smaller than the distance between the first objective lens 18 and the sample measurement surface. In a case where only the first objective lens electric power source 41 is used, the device is configured such that the distance between the first objective lens 18 and the sample measurement surface is smaller than the distance between the second objective lens 26 and the sample measurement surface.

Note that, in a case of carrying out a relatively low-performance measurement in which a high measurement performance is not required, it is not necessary that the distance between the first objective lens 18 and the sample measurement surface be smaller than the distance between the second objective lens 26 and the sample measurement surface even when the first objective lens electric power source 41 only is used. A configuration in which the distance between the second objective lens 26 and the sample measurement surface is smaller than the distance between the first objective lens 18 and the sample measurement surface may be employed. That is, it is only necessary that the sample 23 be positioned between the first objective lens 18 and the second objective lens 26. For instance, in a case of a low-magnification measurement, it is only necessary that the sample 23 be disposed close to the second objective lens 26 and that the first objective lens 18 only be used with use of the first objective lens electric power source 41.

In a case where retarding is carried out in the device illustrated in FIG. 1, the sample 23 has a negative electric potential. A positive voltage may be applied to the electric potential plate 22 while the sample 23 is kept at the GND level (this is called boosting method). The device may alternatively be configured such that a negative voltage is applied to the sample 23 and a positive electric potential is supplied to the electric potential plate 22 for an even higher performance as a low-voltage SEM. The description below deals with a case where the first objective lens 18 has a ground potential, a voltage of +10 kV is applied to the electric potential plate 22, and the sample 23 has a ground potential. The accelerating voltage for this case is −30 kV. Primary electrons have an energy of 30 keV when passing through the first objective lens 18. The primary electrons are accelerated as they travel from the first objective lens 18 toward the electric potential plate 22, and are then decelerated from the vicinity of the electric potential plate 22 toward the sample 23. The above conditions are simulated to produce the data below. The respective shapes of the sample 23 and electric potential plate 22 are assumed to be identical to those for the simulation data 4.

(Simulation Data 6)
Dprobe=1.31 nm, Dg=0.904, Ds=0.493, Dc=0.389, Dd=0.710,
Cs=1.29 mm, Cc=2.56 mm, α=9.13 mrad, M3=0.0244

The above data indicates an improved probe diameter as compared to a case where no boosting is carried out (simulation data 2).

Signal electrons 21 are accelerated as they travel from the sample 23 to the electric potential plate 22, and are then decelerated as they travel from the electric potential plate 22 to the detector 20. In a case where the detector 20 is a semiconductor detector 20, it can detect backscattered electrons 21b, but the semiconductor detector 20, which has a ground potential, cannot detect secondary electrons 21a as they are decelerated. The secondary electrons 21a can be detected by the secondary electron detector 19. Applying a retarding voltage to the sample 23 allows the semiconductor detector 20 to detect secondary electrons 21a as well.

With reference to FIG. 7, the description below deals with how a point of intersection of deflected trajectories is moved through adjustment of the two-stage deflection coil unit 17. The two-stage deflection coil unit 17 is used to scan the surface of a sample 23 two-dimensionally. The two-stage deflection coil unit 17 includes an upper-stage deflection coil 17a on the electron source side and a lower-stage deflection coil 17b on the sample side.

The two-stage deflection coil unit 17 is, as illustrated in FIG. 1, controlled by (i) an upper-stage deflection electric power source 43 configured to change the intensity of the upper-stage deflection coil 17a, (ii) a lower-stage deflection electric power source 44 configured to change the intensity of the lower-stage deflection coil 17b, and (iii) a control device 45 configured to control the upper-stage deflection electric power source 43 and the lower-stage deflection electric power source 44.

The upper-stage deflection coil 17a and the lower-stage deflection coil 17b are, as viewed from the inside of the first objective lens 18, disposed on the side from which a primary electron beam 12 travels. In a case where the upper-stage deflection coil 17a and the lower-stage deflection coil 17b are disposed upstream of the principal plane of the first objective lens 18 or where a lower-stage deflection member is placed at the same position as the principal plane of the lens, the upper-stage deflection coil 17a and lower-stage deflection coil 17b or the lower-stage deflection member is positioned upstream of an outer magnetic pole 18b (see FIG. 7, which also shows an inner magnetic pole 18a). The ratio of the respective electric currents used by the upper-stage deflection electric power source 43 and the lower-stage deflection electric power source 44 can be changed by the control device 45.

(a) of FIG. 7 illustrates a case where the two-stage deflection coil unit 17 causes electrons to each travel in a trajectory that passes through the vicinity of a point of intersection of the optical axis and the principal plane of the first objective lens 18. The two-stage deflection coil unit 17 is configured as above in a case where the first objective lens 18 is used as a main lens (see FIG. 2). If the SEM is configured as illustrated in (a) of FIG. 7 in a case where the second objective lens 26 is used as a main lens, the SEM will have a large deflection aberration, with the result that an image with a lower magnification will be distorted more. In a case where the second objective lens 26 is used as a main lens, the ratio of the respective intensities of the upper-stage deflection coil 17a and the lower-stage deflection coil 17b is adjusted so that electrons each travel in a trajectory that passes through the vicinity of a point of intersection of the optical axis and the principal plane of the second objective lens 26 as illustrated in (b) of FIG. 7. This adjustment is carried out by the control device 45, which is configured to adjust the ratio of the respective electric currents used by the upper-stage deflection electric power source 43 and the lower-stage deflection electric power source 44. This configuration reduces image distortion. The method of adjusting the ratio of the respective electric currents to shift a point of intersection of deflected trajectories may be replaced with, for example, (i) a method of switching between coils with different numbers of turns with use of a relay or the like (that is, a method of using a plurality of coils having different numbers of windings and selecting, through a control device, which coil to use) or (ii) in a case where an electrostatic lens is used, a method of switching voltages (that is, a method of changing the ratio of voltages used).

The deflection coil unit 17 may be disposed in a gap inside the first objective lens 18 as illustrated in FIG. 7. The deflection coil unit 17 may be positioned inside the first objective lens 18 or more upstream thereof along the path of a charged particle beam as illustrated in FIG. 1. In a case where electrostatic deflection is utilized, the deflection coils are replaced with deflection electrodes.

Embodiment 2

With reference to FIG. 8, the following description will discuss a simple device configuration that does not include a first objective lens 18.

This configuration includes a semiconductor detector 20 below the lower-stage deflection coil 17b. The absence of a first objective lens 18 allows the distance between the lower-stage deflection coil 17b and the second objective lens 26 to be smaller accordingly. A device configuration like this is suitable in terms of downsizing. The SEM of Embodiment 2 can be used in a manner similar to the SEM of Embodiment 1 except that a first objective lens 18 is not used in Embodiment 2. The detector 20 and the second objective lens 26 are separated from each other by a distance of 10 mm to 200 mm.

The members ranging from the electron source 11 to the lower-stage deflection coil 17b in the device illustrated in FIG. 8 constitute an upper unit 51 for causing a primary electron beam 12 to be emitted toward a sample 23. FIG. 8 also shows an electric potential plate and other members disposed therebelow, which constitute a lower unit 52. The lower unit 52 holds the sample 23. The upper unit 51 has a hole section, from which a charged particle beam having passed through the upper unit 51 is emitted from the upper unit 51. The hole section is present in the lower-stage deflection coil 17b. The detector 20 is attached below the hole section. The detector 20 also has an opening through which a primary electron beam 12 passes. The detector 20 is attached below the lower-stage deflection coil 17b in such a manner that the hole section and the opening coincide with each other.

Embodiment 3

Embodiment 3 uses an electron source of the field emission type as the electron source 11. An electron source of the field emission type, as compared to an electron source of the thermoelectronic emission type, has a high luminance, a small light source, a small $\Delta V$ for a primary electron beam 12, and an advantage in terms of chromatic aberration. Embodiment 3 is, for comparison with Embodiment 1, configured such that the second-stage condensing lens 15b and the members therebelow are identical to those of Embodiment 1, that the electron source section is of the field emission type, and that the first-stage condensing lens 15a is absent. The primary electron beam 12 has $\Delta V$ of 0.5 eV, and the electron source has a size So of 0.1 μm. The performance for a case where $Z=-4$ mm, the accelerating voltage Vacc is $-30$ kV, and the first objective lens 18 is unused is calculated as follows:

(Simulation Data 7)

Dprobe=0.974 nm, Dg=0.071, Ds=0.591, Dc=0.248, Dd=0.730,

Cs=1.69 mm, Cc=3.36 mm, $\alpha$=8.88 mrad, M3=0.0249

An electron source of the field emission type has a luminance higher than an electron source of the thermoelectronic emission type. Further, an electron source of the field emission type, which has a single-stage condensing lens unit 15, has a probe current larger than an electron source of the thermoelectronic emission type. The above data shows that the probe diameter is small nevertheless. Dd has the largest value.

The description below deals with another example, in which the accelerating voltage Vacc is $-1$ kV (Vi=1 kV). This example does not use the first objective lens 18, and uses the second objective lens 26 to focus electrons. The condensing lens unit 15 is adjusted so that the probe current remains unchanged. The above conditions are simulated to produce the following results:

(Simulation Data 8)

Dprobe=8.48 nm, Dg=0.071, Ds=0.591, Dc=7.45, Dd=4.00,

Cs=1.68 mm, Cc=3.36 mm, $\alpha$=8.88 mrad, M3=0.0249

The above data shows that an electron source of the thermoelectronic emission type (simulation data 3) has Dprobe of 15.6 nm, indicating that an electron source of the field emission type is superior.

The description below deals with an example in which the electric potential plate 22 and a sample 23 are placed as illustrated in FIG. 1. The sample measurement surface is $Z=-4$ mm.

The results of calculation are shown below for a case where the accelerating voltage Vacc is $-10$ kV, the electric potential plate 22 has an electric potential of 0 V, and the sample 23 is at $-9$ kV (Vi=1 kV). This example does not use the first objective lens 18, and uses only the second objective lens 26 to focus a primary electron beam 12.

(Simulation Data 9)

Dprobe=3.92 nm, Dg=0.071, Ds=2.90, Dc=2.32, Dd=1.26,

Cs=0.260 mm, Cc=0.330 mm, α=28.1 mrad, M3=0.0248

Ds has the largest value among the aberration values. This is because (i) electrons are slower and more likely to be influenced by a magnetic field as they are closer to the sample 23 and (ii) α is excessively large as a result of the magnetic flux density having a larger value at a position closer to the sample 23 and thus the lens being more intense at a position closer to the sample 23. Ds is large as it is proportional to the cube of α. In this case, the first objective lens 18 should be used for improvement.

The following shows data for a case where the first objective lens 18 is used and its intensity is optimally adjusted (that is, AT (ampere-turn) is approximately 0.31 that in the simulation data 1).

(Simulation Data 10)

Dprobe=2.68 nm, Dg=0.103, Ds=1.03, Dc=1.68, Dd=1.82,

Cs=0.279 mm, Cc=0.344 mm, α=19.5 mrad, M3=0.0358

The above data shows that although the aberration coefficients themselves are poorer, the probe diameter is improved as a result of adjustment of a.

For comparison with Embodiment 1, this simulation uses an objective-lens aperture 16 having a bore diameter of 21.8 microns, which is equal to that in Embodiment 1. An electron source of the field emission type, which has a high luminance and which includes a single-stage condensing lens unit 15, can have an even smaller bore diameter. The main aberration is the diffraction aberration as a result.

As described above, Embodiment 3 uses a second objective lens 26 and carries out retarding to provide a lens system having a large a value and a reduced diffraction aberration. Embodiment 3, in other words, allows a charged particle beam device to include a second objective lens having a low aberration. Embodiment 3 can detect signal electrons with a high sensitivity, and provides a high resolution inexpensively.

Embodiment 3, in which signal electrons do not pass through a first objective lens, allows a detecting section to have a simple structure. The second objective lens has a magnetic flux density along the optical axis which magnetic flux density is distributed in such a pattern as to be higher at a position closer to the sample, and is thus a low-aberration lens. Supplying a negative electric potential to a sample allows (i) the lens to be more intense at a position closer to the sample and (ii) the objective lens to have an even lower aberration. Signal electrons are accelerated by the electric field caused by a retarding voltage applied to the sample, and enter the detector with amplified energy. The detector thus has a high sensitivity. The configuration described above makes it possible to provide a charged particle beam device having a high resolution.

Embodiment 4

The following description will discuss a device configuration of an SEM (that is, an example charged particle beam device) of Embodiment 4. In the description below, any member of Embodiment 4 (and its variations) that is similar to a member of any of the embodiments described above is assigned an identical reference sign, and is not described here in detail.

The overall configuration described above of Embodiment 1 applies similarly to Embodiment 4 as follows: The upper unit 51 is constituted by the members ranging from the electron source 11 to the first objective lens 18. A primary electron beam 12 is emitted from the upper unit 51 to a sample 23. The lower unit 52 includes a second objective lens 26. The lower unit 52 holds the sample 23. The backscattered electrons 21b are detected similarly and the secondary electron detector 19 and the detector 20 (in Embodiment 4, these detectors may be collectively referred to as first detectors 19 and 20) and the like are disposed similarly. The secondary electron detector 19 is provided so as to detect secondary electrons 21a.

Embodiment 4 is different from the foregoing embodiments in that a second detector is provided between the first objective lens 18 and the second objective lens 26. The second detector is different from the first detectors 19 and 20, which are for detection of signal electrons 21. The second detector is disposed so as to receive electrons or electromagnetic waves which have been emitted from or reflected at the sample 23 and which are different from those to be detected by the first detectors. The second detector detects electrons or electromagnetic waves which are different from those to be detected by the first detectors. Note that, in regard to the first detectors (i.e., the detector 20 and the secondary electron detector 19), an arrangement in which one of the first detectors is provided and the other is omitted may be employed.

In Embodiment 4, the second detector is positioned lower (closer to the sample 23, second objective lens 26, and the like) than the first objective lens 18. In particular, the position at which electrons or electromagnetic waves are received by a part of the second detector is lower (closer to the second objective lens 26) than the positions at which backscattered electrons 21b or secondary electrons 21a are received by the first detectors 19 and 20. The position at which electrons or electromagnetic waves are received by a part of the second detector is closer to an incident position at which the primary electron beam 12 is incident on the sample 23 than the positions at which backscattered electrons 21b or secondary electrons 21a are received by the first detectors 19 and 20 are to the incident position. Alternatively, the position at which electrons or electromagnetic waves are received by a part of the second detector may be further away from the incident position at which the primary electron beam 12 is incident on the sample 23 than the positions at which backscattered electrons 21b or secondary electrons 21a are received by the first detectors 19 and 20 are from the incident position.

The second detector in this arrangement is not limited, provided that the second detector is capable of detecting any of the following electron and electromagnetic waves. The second detector may be capable of detecting, for example, an electromagnetic wave that the sample 23 emits upon incidence of the primary electron beam 12 thereon. Examples of this kind of electromagnetic wave include characteristic X-rays, continuous X-rays, and cathodoluminescence (CL). Alternatively, the second detector may be capable of detecting, for example, an electromagnetic wave that has been incident on and reflected by the sample 23. Examples of this kind of electromagnetic wave include light rays such as visible rays, infrared rays, and ultraviolet rays. Alternatively, the second detector may be capable of detecting, for example, an Auger electron that the sample 23 emits upon incidence of the primary electron beam 12 thereon. Embodiment 4 includes a second detector that is capable of detecting any of the above electron and electromagnetic waves, in addition to the first detector(s) 19 and/or 20. This makes it possible to carry out various analyses and observations on the sample 23.

The following description will discuss a specific example of Embodiment 4.

FIG. 9 is a cross-sectional view generally illustrating an example of a device configuration of an SEM in accordance with Embodiment 4 of the present invention.

As illustrated in FIG. 9, the space above the top face of the lower unit 52 of the SEM is enclosed by a vacuum wall 60. With this arrangement, members such as the first objective lens 18, the first detectors 19 and 20, and the sample 23 are disposed in a vacuum environment. The sample 23 is disposed on the sample stage 24, which is placed on the top face of the second objective lens 26 with the insulating sheet 25 therebetween. The detector 20 for detection of signal electrons 21 is disposed at the lowermost portion of the first objective lens 18. The secondary electron detector 19 for detection of secondary electrons 21a is positioned lateral to the first objective lens 18.

Note, here, that the SEM illustrated in FIG. 9 includes a second detector 110 for detection of a characteristic X-ray 121 emitted from the sample 23. The second detector 110 is an energy dispersive X-ray (EDX [also called EDS]) spectrometer. The second detector 110 is attached to the SEM as an auxiliary device. This SEM enables an EDX analysis of the sample 23, as well as the observation of the sample 23 based on the detection of the signal electrons 21. The second detector 110 is positioned so as not to hinder the detection of the signal electrons 21 by the first detectors 19 and 20, and the detection of the signal electrons 21 and the detection of the characteristic X-ray 121 can be carried out simultaneously (concurrently). Note, however, that this does not imply any limitation.

The second detector 110 is structured such that an arm part 113 extends substantially linearly from a main body, which is disposed outside the vacuum wall 60, to the inner space enclosed by the vacuum wall 60. The arm part 113 is inserted in the vacuum space enclosed by the vacuum wall 60. The arm part 113 has a plate-like part 114, which is plate-like in shape, at its end. The arm part 113 and the plate-like part 114 are made of metal and have electric conductivity.

A mounting part 65 is attached to the vacuum wall 60 with use of, for example, an O-ring, such that hermeticity is maintained. The second detector 110 is secured to the mounting part 65 with use of, for example, a plurality of adjusting bolts 67 and nuts. The adjusting bolts 67, nuts, and/or the like are adjusted, and thereby, for example, the positions to which the mounting part 65, the adjusting bolts 67, and/or the like are secured are adjusted. This enables fine adjustment of the position of the second detector 110 relative to the sample 23. The major directions of movement of the second detector 110 are: vertical directions (directions indicated by arrows Z in FIG. 9; a direction in which the primary electron beam 12 travels); and directions along the length of the arm part 113 (directions indicated by arrows Y in FIG. 9). By adjusting the position of the second detector 110 like above, it is possible to change the position of the end of the arm part 113, that is, the position of the plate-like part 114. It is possible to change the position of the plate-like part 114 relative to the sample 23, that is, it is possible to change the position of the plate-like part 114 relative to a position through which the primary electron beam 12 passes. This enables adjustment in height and in the foregoing four directions even in a case where the primary electron beam 12 is focused with use of the first objective lens 18. The second detector 110 and the plate-like part 114 can be moved greatly along the length direction of the arm part 113 (a direction indicated by arrow Y in FIG. 9) and stored when not used.

The plate-like part 114 is placed so as to be substantially perpendicular to the direction of travel of the primary electron beam 12 (this direction hereinafter may be referred to as the optical axis). The plate-like part 114 has a hole section 114a. The position of the plate-like part 114 is adjusted so that the primary electron beam 12 passes through the hole section 114a. The plate-like part 114 has an X-ray detecting part 120 at its surface facing the sample 23 (the lower surface of the plate-like part 114 in FIG. 9). The X-ray detecting part 120 is, for example, a silicon drift detector (SDD), a transition edge sensor (TES), or the like. The X-ray detecting part 120 receives the characteristic X-ray 121 that the sample 23 emits upon incidence of the primary electron beam 12 thereon. Upon reception of the characteristic X-ray 121 by the X-ray detecting part 120, the second detector 110 detects the characteristic X-ray 121 thus received.

The X-ray detecting part 120 may have separate areas, one of which is capable of detecting the characteristic X-ray 121 and the other of which is capable of detecting other signal electrons, electromagnetic waves, and/or the like. The X-ray detecting part 120 may have, at its surface facing the sample, an organic thin film, a beryllium thin film, or the like. This makes it possible to cause secondary electrons 21a, backscattered electrons 21b, and the like emitted from the sample 23 to stop and not enter the X-ray detecting part 120, and possible to prevent the X-ray detecting part 120 from being affected by these signal electrons 21 and the like.

The plate-like part 114 of the second detector 110 serves also as an electric potential plate in a case where retarding is carried out. Specifically, the retarding electric power source 27 is connected to the sample stage 24, and the plate-like part 114 is connected to, for example, the ground potential via the arm part 113. The plate-like part 114 functions similarly to the electric potential plate 22 in the foregoing embodiments. It is therefore possible, without having to provide a separate electric potential plate 22, to obtain similar effects to those obtained in a case where the electric potential plate 22 is provided. Note that the potential supplied to the plate-like part 114 is not limited to the ground potential, and may be a positive electric potential or a negative electric potential.

The position of the plate-like part 114 is adjustable depending on need, as described earlier. The first objective lens 18 and the second objective lens 26 are controlled, and retarding voltage is controlled, and thereby a high-resolution observation of the sample 23 can be carried out as with the case with the foregoing embodiments. Furthermore, an EDX analysis of the sample 23 can be carried out along with the observation of the sample 23. This enables various analyses and observations.

By the way, in a case in which, like a conventional case, an objective lens of the SEM is provided only on the same side of the sample 23 as where the primary electron beam 12 is incident on the sample (in the upper portion of FIG. 9) (this case corresponds to a modified version of Embodiment 4 which only includes the first objective lens 18), the objective lens needs to be positioned close to the sample 23 in order to carry out a high-resolution observation.

FIG. 10 is a cross-sectional view schematically illustrating a device configuration of an SEM having a conventional structure.

FIG. 10 illustrates an objective lens 918, a detector 920 for detection of backscattered electrons, and a secondary electron detector 919, of an SEM. For a high-resolution observation, a sample 923 is usually positioned close to the objective lens 918. An attempt to situate an X-ray detector 915 for EDX analysis close to the sample 923 will result in the X-ray detector 915 extending beyond the objective lens 918 toward the sample 923. This increases the likelihood that the X-ray detector 915 makes contact with the sample 923. For the distance between the objective lens 918 and the sample 923 to be reduced, it is necessary that the X-ray detector 915 be displaced horizontally from the objective lens 918.

However, such an arrangement, in which the X-ray detector 915 is positioned away from the sample 923, causes a decrease in detection efficiency. This is because the amount of X-ray incident on the X-ray detector 915 decreases in inverse proportion to the square of the distance. Furthermore, it is difficult to detect an X-ray emitted from the inside of a recess in the surface of the sample 23. This is because, in order for the X-ray detector 915 to detect a characteristic X-ray 121 not blocked by the objective lens 918, it is necessary that the angle of the X-ray detector 915 to the horizontal plane (i.e., a plane perpendicular to the optical axis of the primary electron beam 12) be small (this angle is indicated by al in FIG. 10, and may be referred to as takeoff angle).

In contrast, the structure as illustrated in FIG. 9 includes the second objective lens 26, and thereby it is possible to carry out the observation of the sample 23 at a high resolution even when the upper unit 51 and the second objective lens 26 have a space between them. Furthermore, when seen in terms of EDX analysis, the X-ray detecting part 120 for receiving the characteristic X-ray 121 can be disposed between the upper unit 51 and the second objective lens 26. This makes it possible to reduce the distance between the X-ray detecting part 120 and the sample 23 and also possible to increase the takeoff angle of the characteristic X-ray 121 traveling toward the X-ray detecting part 120 with respect to the sample 23. Since it is possible to increase the takeoff angle, it is possible to detect an X-ray emitted from the inside of a recess in the surface of the sample 23. As the takeoff angle becomes larger, the width of the X-ray passing through the sample 23 becomes narrower, resulting in a higher spatial resolution. Because of these, it is possible to increase the detection solid angle for the X-ray detecting part 120 and increase detection efficiency while maintaining the arrangement that enables SEM image observations under the optimum conditions, and also possible to achieve a higher resolution of the second detector 110.

Note that, as with the case of Embodiment 2 discussed earlier in relation to Embodiment 1, the first objective lens 18 is not essential to the structure as illustrated in FIG. 9. Furthermore, the second detector 110 is not limited to those which serve as an electric potential plate 22 when retarding is carried out, provided that the second detector 110 merely includes an X-ray detecting part for detection of the characteristic X-ray 121 and/or the like.

FIG. 11 is a cross-sectional view illustrating a variation of the device configuration of the SEM in accordance with Embodiment 4.

FIG. 11 illustrates one example of a configuration of an SEM that is capable of carrying out EDX analysis as with the device illustrated in FIG. 9. This SEM has a simpler device configuration than the device illustrated in FIG. 9. As illustrated in FIG. 11, this device is configured such that the primary electron beam 12 is focused with use of the second objective lens 26. The upper unit 51 (constituents of the upper unit 51 other than the two-stage deflection coil unit 17 are not illustrated in FIG. 11) is provided with no objective lenses. Regarding is not carried out, and no electric potential plates are provided.

This device includes the detector 20 and the secondary electron detector 19, and a second detector 210 which is an X-ray detector for detection of the characteristic X-ray 121. As with the foregoing Embodiment 2, the first detectors 19 and 20 are positioned on the same side of the sample 23 as where the primary electron beam 12 is incident on the sample. The secondary electron detector 19 includes, for example, a scintillator 19a, a light guide 19b, and a collector electrode 19c. The electric potential of the scintillator 19a is maintained at, for example, about 10 kV. The electric potential of the collector electrode 19c is maintained, for example, within the range of about −50 V to 300 V. With this, the secondary electrons 21a emitted from the sample 23 are received by the scintillator 19a.

The second detector 210 has an X-ray detecting element 220 situated close to its end. The second detector 210 has, inside thereof, a cooling rod 211 for cooing the X-ray detecting element 220. The second detector 210 has, at its end, a collimator 214 and an X-ray transparent window 220a. The characteristic X-ray 121 emitted from the sample 23 enters the second detector 210 through the collimator 214 and the X-ray transparent window 220a. The entered characteristic X-ray 121 is detected at the X-ray detecting element 220.

In the device illustrated in FIG. 11, the primary electron beam 12 is focused with use of the second objective lens 26. It is therefore possible to observe the sample 23 at a high resolution without having to provide an objective lens on the same side of the sample 23 as where the primary electron beam 12 is incident on the sample. This makes it possible to make the distance from the sample 23 to the first detectors 19 and 20 relatively large while enabling a high-resolution observation. It is therefore possible to dispose the second detector 210 at a position more suitable for EDX analysis. Specifically, it is possible to situate the second detector 210 close to the sample 23 such that a great detection solid angle is obtained, and thus possible to increase the detection efficiency of the second detector 210.

Note that the example configuration of the device illustrated in FIG. 11 may include an objective lens also on the same side of the sample 23 as where the primary electron beam 12 is incident on the sample, as shown in dot-dot-dash line in FIG. 11. Even in a case where the upper unit includes the objective lens in this manner, the use of the second objective lens 26 provides the effects similar to the foregoing effects. That is, it is possible to carry out EDX analysis with use of a more ideally positioned second detector 210 while enabling a high-resolution observation of the sample 23.

FIG. 12 is a cross-sectional view illustrating another variation of the device configuration of the SEM in accordance with Embodiment 4.

The SEM illustrated in FIG. 12 includes, as with the SEM illustrated in FIG. 11, members such as an upper unit 51, a second objective lens 26, and first detectors 19 and 20. This SEM has, in place of the foregoing EDX spectrometer, a second detector 310 attached thereto as an auxiliary device. The second detector 310 detects cathodoluminescence (also called CL). This SEM enables an analysis of the sample 23 based on CL, along with the observation of the sample 23 based on the detection of the signal electrons 21. Specifically, the second detector 310 is positioned so as not to hinder the detection of the signal electrons 21 by the first detectors 19 and 20, and the detection of the signal electrons 21 and the detection of CL can be carried out simultaneously (concurrently). Note, however, that this does not imply any limitation.

The second detector 310 includes an elliptical mirror (a kind of optical element) 320 and an optical fiber 311 attached to a detector body 310a. The elliptical mirror 320 is positioned between the detector 20 and the second objective lens 26 so as to be situated in the path of the primary electron beam 12. Specifically, the elliptical mirror 320 is positioned closer to the sample 23 than the first detectors 19 and 20 are to the sample 23. The elliptical mirror 320 has a hole section through which the primary electron beam 12, the signal electrons 21, and the like pass. The signal electrons 21, which are emitted from or reflected by the sample 23, pass through the hole section and are received by the first detectors 19 and 20.

Upon incidence of the primary electron beam 12, the sample 23 emits a CL 321, which is then incident on the elliptical mirror 320 (a part of the second detector 310). That is, the position at which the CL 321 is received by a part of the second detector 310 is closer to an incident position at which the primary electron beam 12 is incident on the sample 23 than the positions at which the signal electrons 21 are received by the first detectors 19 and 20 are to the incident position.

The elliptical mirror 320 has a specular surface 320b, which is shaped such that the light emitted from the sample 23 is focused onto the end of the optical fiber 311. The CL 321, which entered the second detector 310, is reflected at the specular surface 320b and focused onto the optical fiber 311, and guided through the optical fiber 311 to the detector body 310a. With this, the CL 321 is detected at the second detector 310, and an analysis based on CL using the second detector 310 is carried out.

As described above, in the device illustrated in FIG. 12, the elliptical mirror 320 can be disposed between the detector 20 and the second objective lens 26 so as to be situated in the path of the primary electron beam 12. This makes it possible to efficiently focus the cathodoluminescence 321. It is therefore possible to carry out a high-sensitivity analysis based on CL while enabling a high-resolution observation of the sample 23. Furthermore, a sufficient space can be left between the sample 23 and the detector 20 available for the elliptical mirror 320. This makes it possible to keep a sufficient distance between the elliptical mirror 320 and the sample 23 and to prevent the sample 23 from contacting the elliptical mirror 320.

FIG. 13 is a cross-sectional view illustrating still another variation of the device configuration of the SEM in accordance with Embodiment 4.

FIG. 13 illustrates a variation of the SEM illustrated in FIG. 12. That is, the SEM illustrated in FIG. 13, as with the SEM illustrate in FIG. 12, includes members such as an upper unit 51, a second objective lens 26, and first detectors 19 and 20. To this SEM, a second detector 410 is attached as an auxiliary device to detect CL 321, as with the foregoing second detector 310. In this SEM, retarding is carried out.

The second detector 410 includes a parabolic mirror (a kind of optical element) 420, a detector body 310a, and an optical lens 411. The parabolic mirror 420 has a specular surface 420b, which has a curved shape having its focal point at the position at which CL 321 is emitted from the sample 23. The CL 321, upon incident on the specular surface 420b, is converted into parallel rays and enters the optical lens 411. The CL 321 is refracted and condensed by the optical lens 411 and received by the detector body 310a. In this way, the CL 321 is efficiently detected at the detector body 310a.

The parabolic mirror 420 has, attached to its bottom, an electric potential plate 422 which is a conducting plate. The electric potential plate 422 has a hole section through which the primary electron beam 12, signal electrons 21, and the like pass. The electric potential plate 422 is disposed so as to be positioned close to the sample 23. Furthermore, the insulating sheet 25, the sample stage 24, the insulating material 31, and the like are provided on or above the second objective lens 26. The sample stage 24 is connected to the retarding electric power source 27, and the electric potential plate 422 is connected to the electric potential plate electric power source 28. Because of such a configuration of the SEM, retarding is carried out in this SEM as with the foregoing Embodiment 1.

As described above, the device illustrated in FIG. 13 additionally provides the effects resulting from retarding, in addition to the effects obtained by the device illustrated in FIG. 12. That is, it is possible to reduce the energy of emitted electrons and allow the electrons of the primary electron beam 12 to penetrate only to a shallow depth in the sample 23. This enables a high-resolution observation of surface irregularities of a sample. Furthermore, the electric potential plate 422 can be placed close to the sample 23 and thereby aberration can be reduced, and therefore a high-resolution, low-acceleration SEM can be achieved. The insulating sheet 25, which is disposed between the second objective lens 26 and the sample stage 24, improves withstand voltage, and thus the SEM can be used stably even with a strong magnetic field generated by the second objective lens 26.

In the SEMs illustrated in FIGS. 12 and 13, the positions of the elliptical mirror 320, the parabolic mirror 420, optical components which receive the CL 321, and the like can be fine-adjusted. For instance, the SEMs can be arranged such that: the elliptical mirror 320, the parabolic mirror 420, or the like is held by a member extending from the air as illustrated in FIG. 9; and the position of the elliptical mirror 320, the parabolic mirror 420, or the like is changed by an operation carried out in the air.

The size of the hole section in the elliptical mirror 320 or the parabolic mirror 420, through which the primary electron beam 12 and the like pass, is determined depending on need. Specifically, a relatively small hole section allows passage of a small number of backscattered electrons 21b, but causes an increase in amount of the CL 321. On the other hand, a relatively large hole section causes a decrease in amount of the CL 321, but allows passage of a large number of backscattered electrons 21b.

FIG. 14 is a cross-sectional view illustrating still another variation of the device configuration of the SEM in accordance with Embodiment 4.

The SEM illustrated in FIG. 14 includes, as with the SEM illustrated in FIG. 11, members such as an upper unit 51, a second objective lens 26, the first detectors 19 and 20. This SEM has, in place of the foregoing EDX spectrometer, a second detector 510 attached thereto as an auxiliary device. The second detector 510 serves to provide the function of a light microscope. This SEM enables optical observation of the sample 23, along with the observation of the sample 23 based on the detection of the signal electrons 21. The second detector 510 is positioned so as not to hinder the detection of the signal electrons 21 by the first detectors 19 and 20, and the observation of the sample 23 based on the detection of the signal electrons 21 and the optical observation of the sample 23 can be carried out simultaneously. Note, however, that this does not imply any limitation.

The second detector 510 is a kind of light microscope and has a configuration for fluorescence observation. The second detector 510 includes an optical detector section 510a, a light source 511, an illumination lens 512, an excitation filter 513, an optical objective lens 514, a dichroic mirror 515, an absorption filter 516, and an imaging lens 517. The second detector 510 further includes a reflecting mirror (a kind of optical element) 520. The reflecting mirror 520 is disposed between the detector 20 and the second objective lens 26 so as to be situated in the path of the primary electron beam 12. That is, the reflecting mirror 520 is disposed closer to the sample 23 than the first detectors 19 and 20 are to the sample 23. The reflecting mirror 520 has a hole section through which the primary electron beam 12, the signal electrons 21, and the like pass. The signal electrons 21, which are emitted from or reflected by the sample 23, pass through the hole section and are received by the first detectors 19 and 20.

The light emitted from the light source 511 passes through the illumination lens 512 and the excitation filter 513, and is reflected by the dichroic mirror 515. The light then passes through the optical objective lens 514, and is shined on the sample 23 by the reflecting mirror 520. The sample 23 emits (light emission, fluorescence emission, or reflection) emitted light 521, and the emitted light 521 is incident on the reflecting mirror 520 (a part of the second detector 510). That is, the position at which the emitted light 521 is received by a part of the second detector 510 is closer to an incident position at which the primary electron beam 12 is incident on the sample 23 than the positions at which the signal electrons 21 are received by the first detectors 19 and 20 are to the incident position. The emitted light 521 may be light emitted from the sample 23 due to, for example, a fluorescence phenomenon (in a case where fluorescence observation is carried out), or may be reflected light resulting from visible light or the like reflected at the sample 23 (in a case where a typical observation using visible light or the like is carried out). In the following description, these kinds of light are referred to as the emitted light 521 without distinction.

The emitted light 521, upon incident on the reflecting mirror 520 and reflection at the reflecting mirror 520, passes through the optical objective lens 514, the dichroic mirror 515, and then the absorption filter 516. The emitted light 521 then forms an image on the optical detector section 510a through the imaging lens 517. This allows the optical detector section 510a to detect the emitted light 521.

As described above, in this SEM, the reflecting mirror 520 of the second detector 510 can be disposed between the detector 20 and the second objective lens 26 so as to be situated in the path of the primary electron beam 12. This makes it possible to efficiently carry out an observation using a light microscope, while enabling a high-resolution observation of the sample 23. Furthermore, a sufficient space can be left between the sample 23 and the detector 20 available for the reflecting mirror 520. This makes it possible to keep a sufficient distance between the reflecting mirror 520 and the sample 23 and to prevent the sample 23 from contacting the reflecting mirror 520. Furthermore, the retarding can be carried out as with the SEM illustrated in FIG. 13.

Note that the second detector 510 is not limited to a configuration for fluorescence observation which is a kind of light microscope, but can be any of various optical systems such as a confocal laser scanning microscope. Alternatively, the following arrangement may be employed: without using such a catoptric system, a microscope or the like is disposed directly above the sample 23 to optically capture an image of the sample 23. Also in this arrangement, it is possible to dispose a microscope or the like between the sample 23 and the detector 20 such that the microscope or the like is positioned, relative to the sample 23, more ideally for a high-sensitivity observation. This makes it possible to efficiently carry out an optical observation while enabling a high-resolution observation of the sample 23.

A light source may be provided below the sample 23 (on the same side of the sample 23 as the second objective lens 26). In this case, the light source needs only be disposed such that light emitted from below and passed through the sample 23 (or light emitted from the sample 23) is received by the reflecting mirror 520 and detected at the optical detector section 510a.

In the SEM illustrated in FIG. 14, the positions of the reflecting mirror 520, optical components through which light passes, and the like can be fine-adjusted. For instance, the SEM can be arranged such that: the reflecting mirror 520, an optical component, or the like is held by a member extending from the air as illustrated in FIG. 9; and the position of the reflecting mirror 520, optical component, or the like is changed by an operation carried out in the air.

The size of the hole section in the reflecting mirror 520, through which the primary electron beam 12 and the like pass, is determined depending on need. Specifically, a relatively small hole section allows passage of a small number of backscattered electrons 21b, but causes an increase in amount of the emitted light 521. On the other hand, a relatively large hole section causes a decrease in amount of the emitted light 521, but allows passage of a large number of backscattered electrons 21b.

FIG. 15 is a cross-sectional view illustrating still another variation of the device configuration of the SEM in accordance with Embodiment 4.

The SEM illustrated in FIG. 15 includes, as with the SEM illustrated in FIG. 11, members such as an upper unit 51, a second objective lens 26, and first detectors 19 and 20. This SEM has, in place of the foregoing EDX spectrometer, a second detector 610 attached thereto as an auxiliary device. The second detector 610 is a wavelength-dispersive X-ray spectrometer (WDX). This SEM enables a WDX analysis of the sample 23, along with the observation of the sample 23 based on the detection of the signal electrons 21. The second detector 610 is positioned so as not to hinder the detection of the signal electrons 21 by the first detectors 19 and 20, and the observation of the sample 23 based on the detection of the signal electrons 21 and the WDX analysis of the sample 23 can be carried out simultaneously. Note, however, that this does not imply any limitation.

The second detector 610 includes an X-ray detector 610a and a dispersive crystal 620 which receives an X-ray 621 emitted from the sample 23. The X-ray detector 610a moves along a Rowland circle 618 so as to receive the X-ray 621 diffracted by the dispersive crystal 620. The distance from the sample 23 to the dispersive crystal 620 is changed while maintaining a certain takeoff angle $\alpha 1$ of the X-ray 621. The dispersive crystal 620 can be positioned closer to the sample 23 than the first detectors 19 and 20 are to the sample 23. Alternatively, the dispersive crystal 620 can be positioned further away from the sample 23 than the first detectors 19 and 20 are from the sample 23. The X-ray detector 610a is not limited to those which move along the Rowland circle 618 so as to receive the X-ray 621 diffracted by the dispersive crystal 620. Furthermore, the position at which the X-ray 621 is received by the dispersive crystal 620 (a part of the second detector 610) may be further away from an incident position at which the primary electron beam 12 is incident on the sample 23 than the positions at which the signal electrons 21 are received by the first detectors 19 and 20 are to the incident position.

Since the SEM illustrated in FIG. 15 also includes the second objective lens 26, it is possible to carry out WDX analysis while enabling a high-resolution observation of the sample 23. Furthermore, a sufficient space can be left between the sample 23 and the detector 20 available for the dispersive crystal 620. This makes it possible to employ a large takeoff angle α1 between the X-ray 621 and the horizontal plane. It is therefore possible to efficiently capture the X-ray 521 emitted from a micro region on the sample 23, and possible to carry out a high-sensitivity, high-resolution WDX analysis.

In the SEM illustrated in FIG. 15, the second detector 610 may include a polycapillary (a kind of optical element; illustrated in FIG. 15) 617 which captures the X-ray 621 and converts it into a collimated beam. In this arrangement, the X-ray 621 enters the polycapillary 617 and is converted into a collimated beam, and exits from the polycapillary 617 toward the dispersive crystal 620. Since an end of the polycapillary 617 can be positioned close to the sample 23, it is possible to convert multiple X-rays 621 into a collimated beam and thereby increase the intensity of the X-ray 621 incident on the dispersive crystal 620. This makes it possible to carry out the WDX analysis with a higher sensitivity.

Although the SEM of FIG. 15 includes the polycapillary 617, the polycapillary 617 may be replaced with any of various types of optical element such as a collection mirror or diffraction grating. The second detector 610 may either be a vertical WDX or horizontal WDX. The sample 23, the polycapillary 617, and the X-ray detector 610a are not limited to those which move along the Rowland circle 618. The X-ray detector 610a may be one that detects two-dimensional spectra, such as a CCD camera.

In the SEM illustrated in FIG. 15, the position of the second detector 610 can be fine-adjusted. For instance, the SEM can be arranged such that: members constituting the second detector 610 are held by a member extending from the air as illustrated in FIG. 9; and the position of the second detector 610 is changed by an operation carried out in the air.

FIG. 16 is a cross-sectional view illustrating still another variation of the device configuration of the SEM in accordance with Embodiment 4.

FIG. 16 illustrates a variation of the SEM in which, in addition to the second detector 210 for EDX analysis, a second detector 610 for WDX analysis is provided as an auxiliary device. In this SEM, retarding is carried out. The SEM illustrated in FIG. 16 includes, as with the SEM illustrated in FIG. 11, members such as an upper unit 51, a second objective lens 26, and first detectors 19 and 20.

The second detector 610 for WDX analysis is configured similarly to that illustrated in FIG. 15 described earlier. The second detector 610 includes a polycapillary 617, and thus enables WDX analysis with a higher sensitivity.

The second detector 210 for EDX analysis is configured similarly to that illustrated in FIG. 11 described earlier. In the example illustrated in FIG. 16, an electric potential plate 422 for use in retarding is provided at an end of the second detector 210. The electric potential plate 422 is attached to the housing of the second detector 210 with an electric potential plate fixing part 218 so as to be positioned close to the sample 23.

The electric potential plate 422 has a hole section through which the primary electron beam 12, the signal electrons 21, and the like pass, and is disposed so as to be positioned close to the sample 23. The hole section is positioned such that a characteristic X-ray 121 emitted from the sample 23 is received by a collimator 214 and an X-ray transparent window 220a of the second detector 210. Furthermore, an insulating sheet 25, a sample stage 24, an insulating material 31, and the like are provided on or above the second objective lens 26. The sample stage 24 is connected to the retarding electric power source 27, and the electric potential plate 422 is connected to the electric potential plate electric power source 28. Because of such a configuration of the SEM, retarding is carried out in this SEM as with that of the foregoing Embodiment 1.

In this way, the device illustrated in FIG. 16 allows each of the second detectors 210 and 610 to be positioned close to the sample 23. This enables a high-resolution observation of the sample 23 while maintaining high detection efficiencies of EDX analysis and WDX analysis. The device illustrated in FIG. 16 further provides the effects resulting from retarding, and makes it possible to reduce the energy of emitted electrons and allow the electrons of the primary electron beam 12 to penetrate only to a shallow depth in the sample 23. This enables a high-resolution observation of surface irregularities of a sample. Furthermore, the electric potential plate 422 can be placed close to the sample 23 and thereby aberration can be reduced, and therefore a high-resolution, low-acceleration SEM can be achieved.

In the SEM illustrated in FIG. 16, the positions of members constituting the second detector 210 for EDX analysis, the second detector 610 for WDX analysis, and the like can be fine-adjusted. The electric potential plate 422 may be provided separately from and movable independently of the second detector 210 for EDX analysis.

The electric potential plate 422 may be attached to or close to the second detector 610 for WDX analysis. For instance, the electric potential plate 422 may be attached to the polycapillary 617 at or near the end of the polycapillary 617. The electric potential plate 422 may be provided separately from and movable independently of the polycapillary 617.

In this arrangement, when an electron, X-ray, or the like strikes the electric potential plate 422, the electric potential plate 422 emits a fluorescent X-ray. Because of this, when EDX analysis or WDX analysis is carried out, the X-ray emitted from the sample 23 and the X-ray emitted from the electric potential plate 422 are analyzed together. In order to reduce the effects of this X-ray emitted from the electric potential plate 422 on the results of analyses, it is preferable that the electric potential plate 422 is a thin film made of a light element (non-limiting examples include beryllium thin films, organic thin films, and silicon nitride thin films). In a case where the electric potential plate 422 is constituted by a thin film made of a light element, the X-rays are likely to pass through the electric potential plate 422. Note that, in the case where the electric potential plate 422 is constituted by a thin film made of a light element, the X-rays are likely to pass through the electric potential plate 422 and enter the detectors even in a case where the hole section in the electric potential plate 422 is small.

Alternatively, the electric potential plate 422 may be made from, for example, a material whose composition has a different detection peak from the sample 23 (target to be analyzed), for the purpose of reducing the effects of the X-ray emitted from the electric potential plate 422 on the results of analyses. This makes it easy to eliminate the effects of the electric potential plate 422 on the results of analyses.

Note that the devices illustrated in FIGS. 12 to 16, as with the device illustrated in FIG. 11 described earlier, may also include an objective lens on the same side of the sample 23 as where the primary electron beam 12 is incident on the sample. Further note that, in the SEM as illustrated in FIG. 14, an electric potential plate 422 may be provided and retarding may be carried out, as with other examples.

Further note that, in Embodiment 4, the example as illustrated in FIG. 16 does not imply any limitation, and any combination of the detectors used in the foregoing respective specific examples may be provided in a single device. For instance, the device of Embodiment 4 may include both the second detector 210 (X-ray detector as illustrated in FIG. 11) and the second detector 510 (light microscope as illustrated in FIG. 14). This enables various observations and analyses, and also enables high-resolution observation based on the detection of signal electrons 21.

Embodiment 5

The following description will discuss a device configuration of an SEM (that is, an example charged particle beam device) of Embodiment 5. In the description below, any member of Embodiment 5 (and its variations) that is similar to a member of any of the embodiments described above is assigned an identical reference sign, and is not described here in detail.

The overall configuration described above of Embodiment 1 applies similarly to Embodiment 5 as follows: The upper unit 51 is constituted by the members ranging from the electron source 11 to the first objective lens 18. A primary electron beam 12 is emitted from the upper unit 51 to a sample 23. The lower unit 52 includes a second objective lens 26. The lower unit 52 holds the sample 23. The secondary electron detector 19 and the detector 20 are disposed similarly. The secondary electron detector 19 is provided so as to detect secondary electrons 21a.

FIG. 17 is a cross-sectional view illustrating an example of a device configuration of an SEM in accordance with Embodiment 5 of the present invention.

The SEM illustrated in FIG. 17, as with the SEM illustrated in FIG. 1, includes members such as an upper unit 51, a second objective lens 26, a secondary electron detector 19, and an electric potential plate 22. In this SEM, retarding is carried out. As described above, the SEM of Embodiment 5 is basically similar in configuration to the SEM illustrated in FIG. 1. The SEM of Embodiment 5 differs from that illustrated in FIG. 1 in that the SEM of Embodiment 5 includes a first detector 720 disposed on the lower surface (that is, the surface facing the sample 23) of the electric potential plate 22 and configured to detect backscattered electrons 21b.

The first detector 720 has a hole section 720a through which a primary electron beam 12, secondary electrons 21a, and the like pass. The first detector 720 is, for example, a micro-channel plate detector, a Robinson detector, a semiconductor detector, or the like.

As described above, the device illustrated in FIG. 17 includes a first detector 720 at a position relatively close to a sample 23. Backscattered electrons 21b are incident at a large solid angle, which increases the sensitivity with which to detect backscattered electrons 21b and which in turn allows observation of a sample 23 with a higher sensitivity.

FIG. 18 is a cross-sectional view illustrating a variation of the device configuration of the SEM in accordance with Embodiment 5.

The SEM illustrated in FIG. 18 is basically similar in configuration to the SEM illustrated in FIG. 17. In the SEM of FIG. 18, the electric potential plate 22 has, at its lower surface, a second detector 820 for detection of a characteristic X-ray 121, in addition to the first detector 720.

The first detector 720 and the second detector 820 in combination form a detection unit. The detection unit is for example constituted by, when seen from the second objective lens 26-side, the first detector 720 disposed in one region and the second detector 820 disposed in another region. The detection unit has a hole section through which the a electron beam 12, secondary electrons 21a, and the like pass. The first detector 720 and the second detector 820 may be attached to the lower surface of the electric potential plate 22 separately from each other.

As described above, the SEM illustrated in FIG. 18 includes the first detector 720 and the second detector 820 at a position relatively close to the sample 23. That is, the distance between the position at which the signal electrons 21 are received by the first detector 720 and the position at which the primary electron beam 12 is incident on the sample 23 is substantially equal to the distance between the position at which the characteristic X-ray 121 is received by the second detector 820 and the position at which the primary electron beam 12 is incident on the sample 23. Therefore, the backscattered electrons 21b are incident on the first detector 720 at a large solid angle, and the characteristic X-ray 121 is incident on the second detector 820 at a large solid angle. This increases the sensitivity of the first detector 720 with which to detect backscattered electrons 21b and which in turn allows observation of the sample 23 with a higher sensitivity. It is also possible to efficiently carry out EDX analysis by the second detector 820 while enabling a high-resolution observation of the sample 23. The second detector 820 is positioned so as not to hinder the detection of the backscattered electrons 21b by the first detector 720, and the observation of the sample 23 based on the detection of the backscattered electrons 21b and the EDX analysis can be carried out simultaneously.

The second detector 820 may be replaced with some other kind of detector. The following arrangement may be employed: a combination of detectors specifically discussed as examples in Embodiment 4 is provided above the electric potential plate 22. This enables various observations and analyses, and also enables a high-resolution observation based on the detection of signal electrons 21. A first detector 20 may be provided above the electric potential plate 22.

In Embodiment 5, the hole section 720a of the first detector 720 may have a small dimension that allows a primary electron beam 12 to pass therethrough. The hole section 720a is, for example, a circular through hole having a diameter of preferably approximately 1 mm to 2 mm. The hole section 720a having a small diameter as above prevents most backscattered electrons 21b from passing through the electric potential plate 22 upward. Thus, most of the signal electrons 21 incident on the secondary electron detector 19 or detector 20 are secondary electrons 21a. This makes it possible to form a clear secondary electron image that is not mixed with a backscattered electron image.

[Other]

The present invention is described herein on the basis of the embodiments above; however, the disclosure of the embodiments and drawings should not be construed as limiting the present invention. For instance, while the drawings show that a charged particle beam travels from a charged particle source to a sample 23 in a straight-line trajectory, using an energy filter or the like can bend the trajectory. A charged particle beam may travel in an originally bent trajectory. Such cases are also covered by the technical scope of the claims. In a case involving use of a second detector 110 (or 210, 310, 410, 510, 610, or 820), the first detector 20 can be disposed inside the first objective lens 18 and/or can be disposed closer to the electron source 11 than the first objective lens 18 is to the electron source 11. In a case involving use of an ion beam microscope and negative ions as charged particles, the negative ions can be regarded similarly to electrons, and Embodiment 1, Embodiment 4, or Embodiment 5 can thus be applied to an ion beam microscope as well. In the case of ions, which have a mass larger than electrons, Embodiment 1, Embodiment 4, and Embodiment 5 may be varied such that the condensing lens unit 15 includes electrostatic lenses, that the deflection coil unit 17 utilizes electrostatic deflection, that the first objective lens 18 is an electrostatic lens, and that the objective lens 26 is a magnetic lens.

Furthermore, in a case where positive ions are used as charged particles (as from a He+ ion source), the ion source is accelerated by a positive acceleration electric power source 14. In a case where retarding is not carried out, an EPMA can be configured similarly to Embodiment 1, Embodiment 4, or Embodiment 5. In a case where retarding is carrying out, an EPMA can be configured similarly to any of the above-described embodiments except that the retarding electric power source 27 is replaced with a positive electric power source. In this case, if the electric potential plate 22 or the electric potential plate 422 has a ground potential, signal electrons 21 emitted from a sample 23, which are negatively charged, will be pulled back toward the sample 23 in an unintended manner. To address this, the electric potential plate electric power source 28 simply needs to be adjusted so that the electric potential plate 22 or the electric potential plate 422 has an electric potential higher than that of the sample 23. The SEM may, for instance, be configured such that the acceleration electric power source 14 for a charged particle beam is at +7 kV, the upper unit 51 has a ground potential, the electric potential plate 22 or the electric potential plate 422 is at +6 kV, and the sample 23 is at +5 kV. This configuration allows a first detector 720 disposed at the position of the electric potential plate 22 or the electric potential plate 422 to detect signal electrons 21. Alternatively, the first detector 720 may be disposed on the surface, which faces the He+ ion source, of the electric potential plate 22. This surface is, in FIG. 17, the surface of the electric potential plate 22 opposite the first detector 720. In this case, if the signal electrons 21 from the sample 23 pass through the opening in the electric potential plate 22 and fly toward the upper unit 51, the signal electrons 21 are pulled back by the positive electric potential of the electric potential plate 22 if the upper unit 51 has a ground potential. There is also a case where the signal electrons 21 are pulled by the positive electric potential of the secondary electron detector 19 and detected by the secondary electron detector 19. It is also possible to detect, at the first detector 720 disposed on the surface, which faces the He+ ion source, of the electric potential plate 22, the signal electrons pulled back by the positive electric potential of the electric potential plate 22. As well as the detection of signal electrons, the detection of electromagnetic waves by the second detector 110 (or 210, 310, 410, 510, 610, or 820) is also available.

Furthermore, in a case where the objective lens (first objective lens 18 or second objective lens 26) is a lens of high intensity (a lens with short focal length), the depth of focus of the objective lens is small and thus the range of heights of the sample 23 at which a focus can be achieved is narrow. For instance, in a case where the sample 23 has irregularities or differences in level in a surface (surface to be observed), it is difficult to observe the entire surface of the sample 23 entirely in focus. This becomes more apparent as the intensity of the objective lens increases (as the focal length decreases), in a case where regarding is carried out with use of the second objective lens 26.

In consideration of this, for capturing an image entirely in focus, it is only necessary that the intensity of the second objective lens 26 be changed with use of a control device 45 and a second objective lens electric power source 42. The focal length is changed along the optical axis direction by changing the intensity of the second objective lens 26, and thereby images at respective focal lengths are captured. Then, an in-focus portion of each image is extracted from each image, and extracted portions are combined, through the use of the control device 45. This makes it possible to create an image with extended depth of focus (EDF).

Furthermore, in capturing images at respective focal lengths, each focal length can be found from the intensity of the second objective lens 26. It is therefore possible to know a relative height of each extracted portion. This makes it possible to construct three-dimensional data from a plurality of images, and thus possible to display a three-dimensional image through a display device.

Furthermore, use of a second detector 110 (or 210, 310, 410, 510, 610, or 820), which is different from the first detector 19 (or 20) for detection of signal electrons 21 (secondary electrons 21*a*, backscattered electrons 21*b*), makes it possible to also detect signals of electromagnetic waves (characteristic X-ray 121, X-ray 621, and CL 321) emitted from the sample 23. The focal length is changed along the optical axis direction by changing the intensity of the second objective lens 26, and thereby the signal electrons 21 (secondary electrons 21*a*, backscattered electrons 21*b*) and the signals of electromagnetic waves are detected at respective focal lengths, enabling capturing of images at the respective focal lengths. The captured region is the same between the images based on the signal electrons 21 and the images based on the signals of electromagnetic waves. An in-focus portion (first in-focus portion) of each image based on the signal electrons 21 (this image is a first image) and an in-focus portion (second in-focus portion) of each image based on the signals of electromagnetic waves (this image is a second image) are combined in the same captured region, thereby making it possible to create an image with extended depth of focus based on the signals of electromagnetic waves.

It becomes also possible to create three-dimensional data based on data of the signals of electromagnetic waves and to reproduce a three-dimensional image on a display device. By displaying a three-dimensional image reproduced from three-dimensional data on a display device, it is possible to observe and evaluate an image three-dimensionally from various points of view and various angles, and also possible to carry out high-resolution, three-dimensional observations of surfaces of elements, fluorescence, or the like. Furthermore, by displaying on a display device a combined image obtained by combining images based on the signal electrons 21 and images based on the signals of electromagnetic waves, it is also possible to create an image that is easy for observers to understand. Alternatively, images captured with use of a light microscope may be combined with images based on the signal electrons 21.

Features of any of the foregoing embodiments may be combined according to need.

It is understandable from the descriptions provided above that the present invention is easily applicable to EPMAs (which are charged particle beam devices), electron beam devices such as electron beam lithography devices, and ion beam devices such as ion beam microscopes.

The embodiments and variations described above are illustrative in any respect, and should not be construed as limitative. The scope of the present invention is defined not by the description above but by the claims, and intends to cover any variations in meaning and range that are equivalent to the claims.

According to an aspect of the present invention, a charged particle beam device includes: a charged particle source configured to emit a charged particle beam; an acceleration electric power source connected to the charged particle source and configured to accelerate the charged particle beam emitted by the charged particle source; a second objective lens configured to focus the charged particle beam onto a sample; and a second detector configured to receive at least one of (i) a first electromagnetic wave that the sample emits upon incidence of the charged particle beam thereon and (ii) a second electromagnetic wave that the sample reflects upon incidence of the charged particle beam thereon, and configured to carry out a detection of the first electromagnetic wave and/or the second electromagnetic wave thus received, the second objective lens being positioned on the opposite side of the sample from where the charged particle beam is incident on the sample.

It is preferable that the charged particle beam device further includes a first detector configured to receive at least one of (i) a backscattered electron that the sample emits upon incidence of the charged particle beam thereon and (ii) a secondary electron that the sample emits upon incidence of the charged particle beam thereon, and configured to carry out a detection of the backscattered electron and/or the secondary electron thus received.

It is preferable that the charged particle beam device is configured such that: the second detector is positioned so as not to hinder the detection of the backscattered electron and/or the secondary electron by the first detector; and the detection of the backscattered electron and/or the secondary electron by the first detector and the detection of the first electromagnetic wave and/or the second electromagnetic wave by the second detector are capable of being carried out simultaneously.

It is preferable that the charged particle beam device is configured such that a distance between a first position at which the first electromagnetic wave and/or the second electromagnetic wave are/is received by a part of the second detector and a second position at which the charged particle beam is incident on the sample is less than or substantially equal to a distance between a third position at which the backscattered electron and/or the secondary electron are/is received by the first detector and the second position.

It is preferable that the charged particle beam device is configured such that: the charged particle beam travels through an upper unit including the charged particle source and is eventually emitted through a hole section in the upper unit toward the sample; and the first detector is attached to a lowermost portion of the hole section.

It is preferable that the charged particle beam device is configured such that the first detector is: a secondary electron detector configured to generate an electric field that attracts the secondary electron that the sample emits in response to the charged particle beam and configured to detect the secondary electron; and positioned lateral to an upper unit that includes the charged particle source and that is configured to emit the charged particle beam.

It is preferable that the charged particle beam device is configured such that: the charged particle beam travels through an upper unit including the charged particle source and is eventually emitted through a hole section in the upper unit toward the sample; and the first detector is positioned closer to the charged particle source than the hole section is to the charged particle source.

It is preferable that the charged particle beam device further includes a retarding electric power source for decelerating the charged particle beam, the retarding electric power source being configured to supply a negative electric potential to the sample.

It is preferable that the charged particle beam device further includes an insulating sheet disposed between the sample and the second objective lens, the insulating sheet insulating the sample and the second objective lens from each other.

It is preferable that the charged particle beam device further includes an electric potential plate disposed above the sample and having a hole section, and the electric potential plate is supplied with a ground potential, a positive electric potential, or a negative electric potential.

It is preferable that the charged particle beam device is configured such that: a charged particle in the charged particle beam is a positive ion; the sample is supplied with a positive electric potential that is positive relative to the ground potential; and the electric potential plate is supplied with an electric potential that is equal to or higher than the positive electric potential of the sample.

It is preferable that the charged particle beam device is configured such that the second detector is disposed on a surface, which faces the sample, of the electric potential plate.

It is preferable that the charged particle beam device further includes an electric potential plate disposed above the sample and having a hole section, and the charged particle beam device includes a plurality of the first detectors, one of which is disposed on a surface, which faces the sample, of the electric potential plate.

It is preferable that the charged particle beam device is configured such that the second detector is configured to detect an X-ray that the sample emits upon incidence of the charged particle beam thereon.

It is preferable that the charged particle beam device is configured such that the second detector includes an optical element disposed close to the sample and is configured to detect cathodoluminescence received by the optical element, the cathodoluminescence being emitted from the sample upon incidence of the charged particle beam.

It is preferable that the charged particle beam device is configured such that the second detector includes an optical element disposed close to the sample and is configured to detect light received by the optical element, the light being reflected or emitted by a surface of the sample in response to light incidence on the surface of the sample.

It is preferable that the charged particle beam device is configured such that the optical element is an elliptical mirror, a parabolic mirror, or a reflecting mirror.

It is preferable that the charged particle beam device is configured such that: the second detector is configured to detect an X-ray that the sample emits upon incidence of the charged particle beam thereon; the second detector includes a receiving part for receiving the X-ray, the receiving part being attached to a plate-like part on an arm part which is electrically conductive; the plate-like part has an opening through which the charged particle beam passes, the plate-like part being positioned close to the sample and positioned on the same side of the sample as where the charged particle beam is incident on the sample; and the plate-like part is supplied with a ground potential, a positive electric potential, or a negative electric potential.

It is preferable that the charged particle beam device further includes a first objective lens different from the second objective lens, the first objective lens being positioned on the same side of the sample as where the charged particle beam is incident on the sample, the second detector being configured to be capable of carrying out the detection both in a case where the second objective lens is used to focus the charged particle beam onto the sample and in a case where the first objective lens is used to focus the charged particle beam onto the sample.

It is preferable that the charged particle beam device further includes a first objective lens different from the second objective lens, the first objective lens being positioned on the same side of the sample as where the charged particle beam is incident on the sample and being configured to change an aperture angle of the charged particle beam incident on the sample.

It is preferable that the charged particle beam device is configured such that a position of the second detector relative to the sample is adjustable.

It is preferable that the charged particle beam device further includes a control device configured to: (i) change a focal length of the second objective lens and thereby capture first images at respective focal lengths and second images at the respective focal lengths, the first images being based on a backscattered electron that the sample emits upon incidence of the charged particle beam thereon or a secondary electron signal that the sample emits upon incidence of the charged particle beam thereon, the second images being based on the first electromagnetic wave and/or the second electromagnetic wave; (ii) extract a first in-focus portion from each of the first images captured at the respective focal lengths, and extract a second in-focus portion from each of the second images captured at the respective focal lengths, the second in-focus portion corresponding to the first in-focus portion; and (ii) combine a plurality of the first in-focus portions thus extracted and a plurality of the second in-focus portions thus extracted to obtain a combined image, and cause a display device to display the combined image.

According to another aspect of the present invention, a scanning electron microscope includes any of the foregoing charged particle beam devices.

REFERENCE SIGNS LIST

11 Charged particle source (electron source)
12 Charged particle beam (primary electron beam)
13 Wehnelt electrode
14 Acceleration electric power source
15 Condensing lens unit
15a First-stage condensing lens
15b Second-stage condensing lens
16 Objective-lens aperture
17 Two-stage deflection coil unit
17a Upper-stage deflection coil
17b Lower-stage deflection coil
18 First objective lens
18a Inner magnetic pole
18b Outer magnetic pole
18c Hole section
19 First detector (Secondary electron detector)
20 First detector (semiconductor detector, Robinson detector, or MCP detector)
21 Signal electron
21a Secondary electron
21b Backscattered electron
22, 422 Electric potential plate
23 Sample
24 Sample stage
25 Insulating plate
26 Second objective lens
26a Central magnetic pole
26b Upper magnetic pole
26c Side-surface magnetic pole
26d Lower magnetic pole
26e Coil section
26f Sealing section
27 Retarding electric power source
28 Electric potential plate electric power source
29 Sample stage plate
30 Electric discharge preventing cylindrical electrode
31 Insulating material
41 First objective lens electric power source
42 Second objective lens electric power source
43 Upper-stage deflection electric power source
44 Lower-stage deflection electric power source
45 Control device
51 Upper unit
52 Lower unit
61 XYZ stage
110, 210, 310, 410, 510, 610, 820 Second detector
113 Arm part
114 plate-like part
121 Characteristic X-ray (a kind of electromagnetic wave)
320 Elliptical mirror (a kind of optical element)
321 Cathodoluminescence (CL; a kind of electromagnetic wave)
420 Parabolic mirror (a kind of optical element)
520 Reflecting mirror (a kind of optical element)
521 Emitted light (a kind of electromagnetic wave)
617 Polycapillary (a kind of optical element)
620 Dispersive crystal
621 X-ray (a kind of electromagnetic wave)
720 First detector on electric potential plate (semiconductor detector, Robinson detector, or MCP detector)
α1 X-ray takeoff angle

The invention claimed is:

1. A charged particle beam device comprising:
a charged particle source configured to emit a charged particle beam;
an acceleration electric power source connected to the charged particle source and configured to accelerate the charged particle beam emitted by the charged particle source;
a deflection section configured to deflect the charged particle beam;
a second objective lens configured to focus the charged particle beam onto a sample;
a second detector configured to receive at least one of (i) a first electromagnetic wave that the sample emits upon incidence of the charged particle beam thereon and (ii) a second electromagnetic wave that the sample reflects upon incidence of the charged particle beam thereon, and configured to carry out a detection of the first electromagnetic wave and/or the second electromagnetic wave thus received; and a magnetic pole constituting the second objective lens, the magnetic pole including:
  a central magnetic pole having a central axis coinciding with an ideal optical axis of the charged particle beam;
  an upper magnetic pole;
  a side-surface magnetic pole in a cylindrical shape; and
  a lower magnetic pole having a disk shape,
the upper magnetic pole having a circular opening at a center of the upper magnetic pole and being in a shape of a disk that is tapered to the center and that is thinner at a position closer to a center of gravity of the central magnetic pole,
the second objective lens being positioned on the opposite side of the sample from where the charged particle beam is incident on the sample,
a distance between the second detector and the sample being shorter than a distance between the deflection section and the sample, and
the second detector being positioned on the same side of the sample as where the charged particle beam is incident on the sample.

2. The charged particle beam device according to claim 1, further comprising a first detector configured to receive at least one of (i) a backscattered electron that the sample emits upon incidence of the charged particle beam thereon and (ii) a secondary electron that the sample emits upon incidence of the charged particle beam thereon, and configured to carry out a detection of the backscattered electron and/or the secondary electron thus received.

3. The charged particle beam device according to claim 2, wherein:
  the second detector is positioned so as not to hinder the detection of the backscattered electron and/or the secondary electron by the first detector; and
  the detection of the backscattered electron and/or the secondary electron by the first detector and the detection of the first electromagnetic wave and/or the second electromagnetic wave by the second detector are capable of being carried out simultaneously.

4. The charged particle beam device according to claim 2, wherein a distance between a first position at which the first electromagnetic wave and/or the second electromagnetic wave are/is received by a part of the second detector and a second position at which the charged particle beam is incident on the sample is less than a distance between a third position at which the backscattered electron and/or the secondary electron are/is received by the first detector and the second position.

5. The charged particle beam device according to claim 2, wherein:
  the charged particle beam travels through an upper unit including the charged particle source and is eventually emitted through a hole section in the upper unit toward the sample; and
  the first detector is attached to a lowermost portion of the hole section.

6. The charged particle beam device according to claim 2, wherein the first detector is
  a secondary electron detector configured to generate an electric field that attracts the secondary electron that the sample emits in response to the charged particle beam and configured to detect the secondary electron, and positioned lateral to an upper unit that includes the charged particle source and that is configured to emit the charged particle beam.

7. The charged particle beam device according to claim 2, wherein:
  the charged particle beam travels through an upper unit including the charged particle source and is eventually emitted through a hole section in the upper unit toward the sample; and
  the first detector is positioned closer to the charged particle source than the hole section is to the charged particle source.

8. The charged particle beam device according to claim 1, further comprising a retarding electric power source for decelerating the charged particle beam, the retarding electric power source being configured to supply a negative electric potential to the sample.

9. The charged particle beam device according to claim 8, further comprising an insulating sheet disposed between the sample and the second objective lens, the insulating sheet insulating the sample and the second objective lens from each other.

10. The charged particle beam device according to claim 1, further comprising an electric potential plate disposed above the sample and having a hole section, wherein
  the first electromagnetic wave and the second electromagnetic wave pass through the hole section, and
  the electric potential plate is supplied with a ground potential, a positive electric potential, or a negative electric potential.

11. The charged particle beam device according to claim 10, wherein:
  a charged particle in the charged particle beam is a positive ion;
  the sample is supplied with a positive electric potential that is positive relative to the ground potential; and
  the electric potential plate is supplied with an electric potential that is equal to or higher than the positive electric potential of the sample.

12. The charged particle beam device according to claim 10, wherein the second detector is disposed on the same side of the electric potential plate as the charged particle source.

13. The charged particle beam device according to claim 2, further comprising an electric potential plate disposed above the sample and having a hole section,
  the charged particle beam device comprising a plurality of the first detectors, one of which is disposed on a surface, which faces the sample, of the electric potential plate.

14. The charged particle beam device according to claim 1, wherein the second detector is configured to detect an X-ray that the sample emits upon incidence of the charged particle beam thereon.

15. The charged particle beam device according to claim 1, wherein the second detector includes an optical element disposed close to the sample and is configured to detect cathodoluminescence received by the optical element, the cathodoluminescence being emitted from the sample upon incidence of the charged particle beam.

16. The charged particle beam device according to claim 1, wherein the second detector includes an optical element disposed close to the sample and is configured to detect light received by the optical element, the light being reflected or emitted by a surface of the sample in response to light incidence on the surface of the sample.

17. The charged particle beam device according to claim 15, wherein the optical element is an elliptical mirror, a parabolic mirror, or a reflecting mirror.

18. The charged particle beam device according to claim 1, wherein:

the second detector is configured to detect an X-ray that the sample emits upon incidence of the charged particle beam thereon;

the second detector includes a receiving part for receiving the X-ray, the receiving part being attached to a plate-like part on an arm part which is electrically conductive;

the plate-like part has an opening through which the charged particle beam passes, the plate-like part being positioned close to the sample and positioned on the same side of the sample as where the charged particle beam is incident on the sample; and the plate-like part is supplied with a ground potential, a positive electric potential, or a negative electric potential.

19. The charged particle beam device according to claim 1, further comprising a first objective lens different from the second objective lens, the first objective lens being positioned on the same side of the sample as where the charged particle beam is incident on the sample, the second detector being configured to be capable of carrying out the detection both in a case where the second objective lens is used to focus the charged particle beam onto the sample and in a case where the first objective lens is used to focus the charged particle beam onto the sample.

20. The charged particle beam device according to claim 1, further comprising a first objective lens different from the second objective lens, the first objective lens being positioned on the same side of the sample as where the charged particle beam is incident on the sample and being configured to change an aperture angle of the charged particle beam incident on the sample.

21. The charged particle beam device according to claim 1, which is configured such that a position of the second detector relative to the sample is adjustable.

22. The charged particle beam device according to claim 1, further comprising a control device configured to:
(i) change a focal length of the second objective lens and thereby capture first images at respective focal lengths and second images at the respective focal lengths, the first images being based on a backscattered electron that the sample emits upon incidence of the charged particle beam thereon or a secondary electron signal that the sample emits upon incidence of the charged particle beam thereon, the second images being based on the first electromagnetic wave and/or the second electromagnetic wave;
(ii) extract a first in-focus portion from each of the first images captured at the respective focal lengths, and extract a second in-focus portion from each of the second images captured at the respective focal lengths, the second in-focus portion corresponding to the first in-focus portion; and
(iii) combine a plurality of the first in-focus portions thus extracted and a plurality of the second in-focus portions thus extracted to obtain a combined image, and cause a display device to display the combined image.

23. The charged particle beam device according to claim 1, further comprising:
a first objective lens different from the second objective lens, the first objective lens being positioned on the same side of the sample as where the charged particle beam is incident on the sample;
a first objective lens electric power source capable of changing an intensity of the first objective lens; and
a second objective lens electric power source capable of changing an intensity of the second objective lens, wherein
the sample is disposed anywhere between the first objective lens and the second objective lens when the first objective lens electric power source only is used, and
the sample is disposed such that a distance between the second objective lens and a measurement surface of the sample is less than a distance between the first objective lens and the measurement surface of the sample when the second objective lens only is used.

24. The charged particle beam device according to claim 18, wherein a part of the second detector serves as an electric potential plate, the part being attached to the opening in the plate-like part.

25. A scanning electron microscope comprising the charged particle beam device recited in claim 1.

* * * * *